(12) United States Patent
San et al.

(10) Patent No.: US 7,098,828 B2
(45) Date of Patent: Aug. 29, 2006

(54) COMPLEX BAND-PASS ΔΣ AD MODULATOR FOR USE IN AD CONVERTER CIRCUIT

(75) Inventors: Hao San, Gunma (JP); Haruo Kobayashi, Gunma (JP); Hiroki Wada, Gunma (JP); Atsushi Wada, Gifu (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 11/157,848

(22) Filed: Jun. 22, 2005

(65) Prior Publication Data

US 2005/0285766 A1 Dec. 29, 2005

(30) Foreign Application Priority Data

Jun. 23, 2004 (JP) ............................ P2004-185206

(51) Int. Cl.
*H03M 3/00* (2006.01)
*H03M 1/00* (2006.01)
*H04B 14/06* (2006.01)

(52) U.S. Cl. ..................... 341/143; 341/141; 375/247
(58) Field of Classification Search ................ 341/143, 341/141; 329/315; 333/17.1; 375/324, 375/344, 247, 269, 316, 332, 345, 346; 708/819; 324/640

See application file for complete search history.

(56) References Cited

U.S. PATENT DOCUMENTS

| | | | | |
|---|---|---|---|---|
| 4,847,872 A | * | 7/1989 | Hespelt et al. | ............... 375/344 |
| 5,757,862 A | * | 5/1998 | Ishizu | ......................... 375/324 |
| 6,160,859 A | * | 12/2000 | Martin et al. | ................ 375/345 |
| 6,218,972 B1 | * | 4/2001 | Groshong | ................. 341/143 |
| 6,225,928 B1 | * | 5/2001 | Green | .......................... 341/143 |
| 6,243,430 B1 | * | 6/2001 | Mathe | ......................... 375/346 |
| 6,317,468 B1 | * | 11/2001 | Meyer | ......................... 375/269 |
| 6,339,621 B1 | * | 1/2002 | Cojocaru et al. | ............ 375/247 |
| 6,590,943 B1 | * | 7/2003 | Ali | ................................. 375/332 |
| 6,683,919 B1 | * | 1/2004 | Olgaard et al. | .............. 375/316 |

(Continued)

FOREIGN PATENT DOCUMENTS

JP 5-275972 10/1993

(Continued)

OTHER PUBLICATIONS

K. Philips, "A 4.4mW 76dB Complex ΣΔ ADC for Bluetooth Receivers", ISSCC Digest of Technical Papers, vol. 46, pp. 64-65, Feb. 2003, no date.

(Continued)

*Primary Examiner*—Patrick Wamsley
(74) *Attorney, Agent, or Firm*—Birch, Stewart, Kolasch & Birch, LLP

(57) ABSTRACT

A complex band-pass ΔΣ AD modulator is provided with a subtracter device, a complex band-pass filter, first and second AD converters, and first and second DA converters. The first and second AD converters and first and second logic circuits are sandwiched by first and second multiplexers. At a first timing of a clock signal, the first multiplexer inputs and outputs the first and second digital signals as they are, and at a second timing thereof, the first multiplexer inputs the first and second digital signals, and outputs the first digital signal as a second digital signal and outputs the second digital signal as a first digital signal. The second multiplexer inputs and outputs first and second analog signals similarly. The first and second logic circuits substantially noise-shapes non-linearities of the first and second DA converters by realizing complex digital and analog filters, using high-pass and low-pass element rotation methods.

15 Claims, 22 Drawing Sheets

U.S. PATENT DOCUMENTS

| | | | |
|---|---|---|---|
| 6,696,843 B1 * | 2/2004 | Beneteau et al. | 324/640 |
| 6,819,274 B1 * | 11/2004 | Krone et al. | 341/141 |
| 6,850,113 B1 * | 2/2005 | Amano | 329/315 |
| 6,864,818 B1 * | 3/2005 | Hezar | 341/143 |
| 6,917,252 B1 * | 7/2005 | Wyszynski | 333/17.1 |
| 6,930,565 B1 * | 8/2005 | Vishinsky | 333/17.1 |
| 6,976,051 B1 * | 12/2005 | Erdogan et al. | 708/819 |

FOREIGN PATENT DOCUMENTS

| | | |
|---|---|---|
| JP | 11-17549 | 1/1999 |
| JP | 2000-244323 | 9/2000 |
| JP | 2002-100992 | 4/2002 |

OTHER PUBLICATIONS

F. Henkel, et al., "A 1-MHz-Banwidth Second-Order Continuous-Time Quadrature Bandpass Sigma-Delta Modulator for Low-IF Radio Receivers", IEEE Journal of Solid-State Circuits, vol. 37, pp. 1628-1635, Dec. 2002, no date.

F. Esfahari, et al., "A fourth Order Continuous-Time Complex Sigma-Delta ADC for Low-IF GSM and EDGE Receivers", Symposium of VLSI Circuits, Digest of Technical Papers, pp. 75-78, Jun. 2003; no date.

R. Schreier, et al., "A 10-300-MHz IF-digitizing IC with 90-105-dB dynamic range and 15-333-kHz bandwidth", IEEE Journal of Solid-State Circuits, vol. 37, pp. 1636-1644, Dec. 2002, no date.

T. Salo, et al., "A dual-Mode 80 MHz bandpass $\Delta\Sigma$ modulator for a GSM/WCDMA IF-Receiver", ISSCC Digest of Technical Papers vol. 45, pp. 218-219, Feb. 2002, no date.

S.A. Jantzi, et al., "Quadrature bandpass $\Delta\Sigma$ Modulation for Digital Radio," IEEE Journal of Solid-State Circuits, vol. 32, pp. 1935-1950, Dec. 1997, no date.

S. R. Norsworthy, et al. (editiors), "Delta-Sigma Data Converters, —Theory, Design and Simulation", IEEE Press, 1997, no month.

T. Ueno, et al. "A fourth-Order Bandpass $\Delta$-$\Sigma$ Modulator Using Second-Order Bandpass Noise-Shaping Dynamic Element Matching", IEEE Journal of Solid -State Circuits, vol. 37, pp. 809-816, Jul. 2002, no date.

T. Shui, et al. "Mismatch Shaping for a Current-Mode Multibit Delta-Sigma DAC", IEEE Journal of Solid-State Circuits, vol. 34, pp. 331-338, Mar. 1999, no date.

L. R. Carley, "A Noise-Shaping Coder Topology for 15+ Bit Converters", IEEE Journal of Solid-State Circuits, vol. 24, pp. 267-273, Apr. 1989, no date.

E. Fogleman, et al., "A 3.3-V Single-Poly CMOS Audio ADC Delta-Sigma Modulator With 98.dB Peak SINAD and 105-dB Peak SFDR", IEEE Journal of Solid-State Circuits, vol. 35, pp. 297-307, Mar. 2000, no date.

R. Shreier, et al., "Speed vs. Dynamic Range Trade-Off in Oversampling Data Converters", in C. Toumazou et al. (editors), Trade-Offs in Analog Circuit Design, The Designer's Companion, Kluwer Academic Publishers, pp. 631, 644 and 645, 2002, no month.

Y. Yang, et al., "A 114dB 68mW Chopper-Stablized Stereo Multi-Bit Audio A/D Converter", ISSCC Digest of Technical Papers, vol. 46, pp. 56-57, Feb. 2003, no date.

B. Razavi, "Principles of Data Conversion System Design", IEEE Press, pp. 90-91, 1995, no month.

A. Swaminathan, "A Single-IF Receiver Architecture Using a Complex Sigma-Delta Modulator", Master of Engineering Thesis, Carleton University, Ottawa, Ontario, Canada, 1997, no month.

D. B. Barkin, et al., "A CMOS Oversampling Bandpass Cascaded D/A Converter With Digital FIR and Current-Mode Semi-Digital Filtering", Symposium of VLSI Circuits, Digest of Technical Papers, pp. 79-82, Jun. 2003, no date.

H. San, et al,. "A Noise-Shaping Algorithm of Multi-Bit DAC Nonlinearities Used in Complex Band-Pass $\Delta\Sigma$ AD Modulators", Circuit and System Workshop at Karuizawa by the Institute of Electronics, Information and Communication Engineers in Japan, Published by the Institute of Electronics, Information and Communication Engineers, in Japan, pp. 85-90, Apr. 2003 together with a partial English translation thereof, no date.

H. San, et al. "An Element Rotation Algorithm for Multi-Bit DAC Nonlinearities in Complex Bandpass $\Delta\Sigma$ AD Modulators", IEEE 17th International Conference on VLSI Design, Mumbai, India, pp. 151-156, Jan. 2004, no date.

H. San, et al., "A Noise-Shaping Algorithm of Multi-Bit DAC Nonlinearities in Complex Bandpass $\Delta\Sigma$ AD Modulators", IEICE Transactions on Fundamentals, vol. E87-A, No. 4, pp. 792-800, Apr. 2004, no date.

K. Philips, "A 4.4mW 76dB Complex $\Delta\Sigma$ ADC for Bluetooth Receivers", ISSCC Digest of Technical Papers, vol. 46, pp. 64-65, Feb. 2003, no date.

F. Henkel, et al., "A 1-MHz-Banwidth Second-Order Continuous-Time Quadrature Bandpass Sigma-Delta Modulator for Low-IF Radio Receivers", IEEE Journal of Solid-State Circuits, vol. 37, pp. 1628-1635, Dec. 2002, no date.

F. Esfahani, et al., "A fourth Order Continuous-Time Complex Sigma-Delta ADC for Low-IF GSM and EDGE Receivers", Symposium of VLSI Circuits, Digest of Technical Papers, pp. 75-78, Jun. 2003, no date.

R. Schreier, et al., "A 10-300-MHz IF-digitizing IC with 90-105-dB dynamic range and 15-333-kHz bandwidth", IEEE Journal of Solid-State Circuits, vol. 37, pp. 1636-1644, Dec. 2002, no date.

T. Salo, et al., "A dual-Mode 80 MHz bandpass $\Delta\Sigma$ modulator for a GSM/WCDMA IF- Receiver", ISSCC Digest of Technical Papers vol. 45, pp. 218-219, Feb. 2002, no date.

S.A. Jantzi, et al., "Quadrature bandpass $\Delta\Sigma$ Modulation for Digital Radio," IEEE Journal of Solid-State Circuits, vol. 32, pp. 1935-1950, Dec. 1997, no date.

S. R. Norsworthy, et al. (editors), "Delta-Sigma Data Converters, —Theory, Design, and Simulation", IEEE Press, 1997, no month.

T. Ueno, et al. "A fourth-Order Bandpass $\Delta\Sigma$ Modulator Using Second-Order Bandpass Noise-Shaping Dynamic Element Matching", IEEE Journal of Solid-State Circuits, vol. 37, pp. 809-816, Jul. 2002, no date.

T. Shui, et al. "Mismatch Shaping for a Current-Mode Multibit Delta-Sigma DAC", IEEE Journal of Solid-State Circuits, vol. 34, pp. 331-338, Mar. 1999, no date.

L. R. Carley, "A Noise-Shaping Coder Topology for 15+ Bit Converters", IEEE Journal of Solid-State Circuits, vol. 24, pp. 267-273, Apr. 1989, no date.

E. Fogleman, et al., "A 3.3-V Single-Poly CMOS Audio ADC Delta-Sigma Modulator With 98.dB Peak SINAD and 105-dB Peak SFDR", IEEE Journal of Solid-State Circuits, vol. 35, pp. 297-307, Mar. 2000, no date.

R. Schreier, et al., "Speed vs. Dynamic Range Trade-Off in Oversampling Data Converters", in C. Toumazou et al. (editors), Trade-Offs in Analog Circuit Design, The Designer's Companion, Kluwer Academic Publishers, pp. 631, 644 and 645, 2002, no month.

Y. Yang, et al., "A 114dB 68mW Chopper-Stablized Stereo Multi-Bit Audio A/D Converter", ISSCC Digest of Technical Papers, vol. 46, pp. 56-57, Feb. 2003, no data.

B. Razavi, "Principles of Data Conversion System Design", IEEE Press, pp. 90-91, 1995, no month.

A. Swaminathan, "A Single-IF Receiver Architecture Using a Complex Sigma-Delta Modulator", Master of Engineering Thesis, Carleton University, Ottawa, Ontario, Canada, 1997, no month.

D. B. Barkin, et al., "A CMOS Oversampling Bandpass Cascaded D/A Converter With Digital FIR and Current-Mode Semi-Digital Filtering", Symposium of VLSI Circuits, Digest of Technical Papers, pp. 79-82, Jun. 2003, no date.

H. San, et al,. "A Noise-Shaping Algorithm of Multi-Bit DAC Nonlinearities Used in Complex Band-Pass $\Delta\Sigma$ AD Modulators", Circuit and System Workshop at Karuizawa by the Insittue of Electronics, Information and Communication Engineers in Japan, Published by the Institute of Electronics, Information and Communication Engineers, in Japan, pp. 85-90, Apr. 2003 together with a partial English translation thereof: no date.

H. San, et al. "An Element Rotation Algorithm for Multi-Bit DAC Nonlinearities in Complex Bandpass ΔΣ AD Modulators", IEEE 17th International Conference on VLSI Deisgn, Mumbai, India, pp. 151-156, Jan. 2004, no date.

H. San, et al., "A Noise-Shaping Algorithm of Multi-Bit DAC Nonlinearities in Complex Bandpass ΔΣ AD Modulators", IEICE Transactions on Fundamentals, vol. E87-A, No. 4, pp. 792-800, Apr. 2004, no date.

* cited by examiner

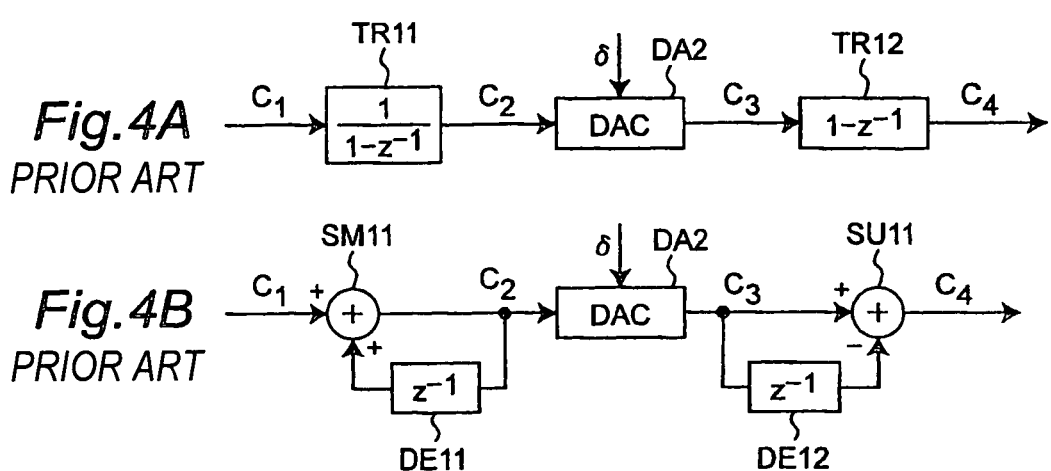
*Fig.4A* PRIOR ART
*Fig.4B* PRIOR ART
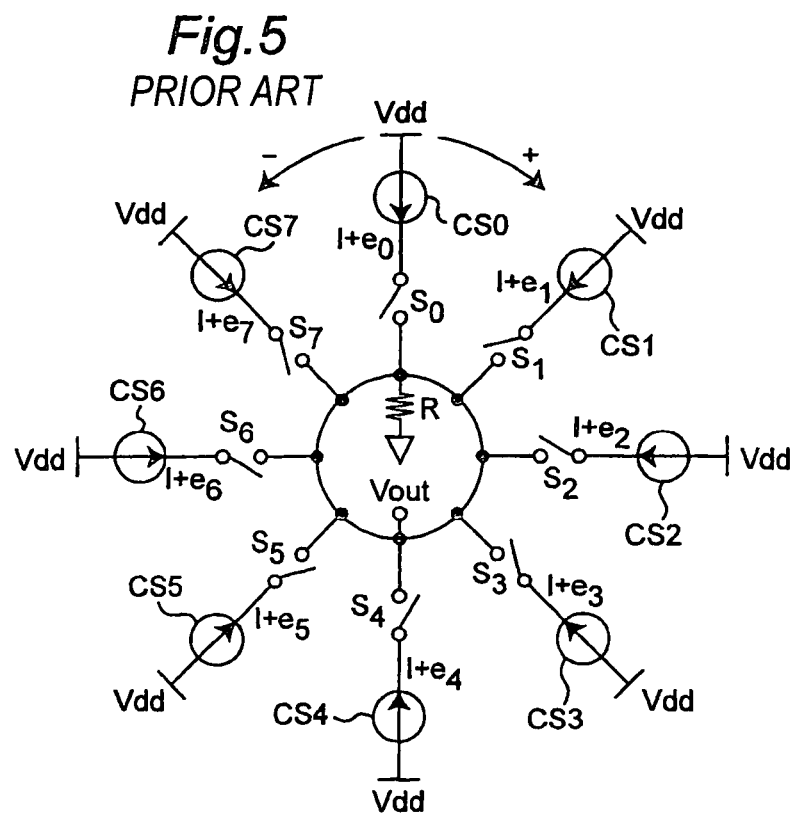
*Fig.5* PRIOR ART

COMPLEX BAND-PASS ΔΣ AD MODULATOR 7A

COMPLEX BAND-PASS FILTER 10

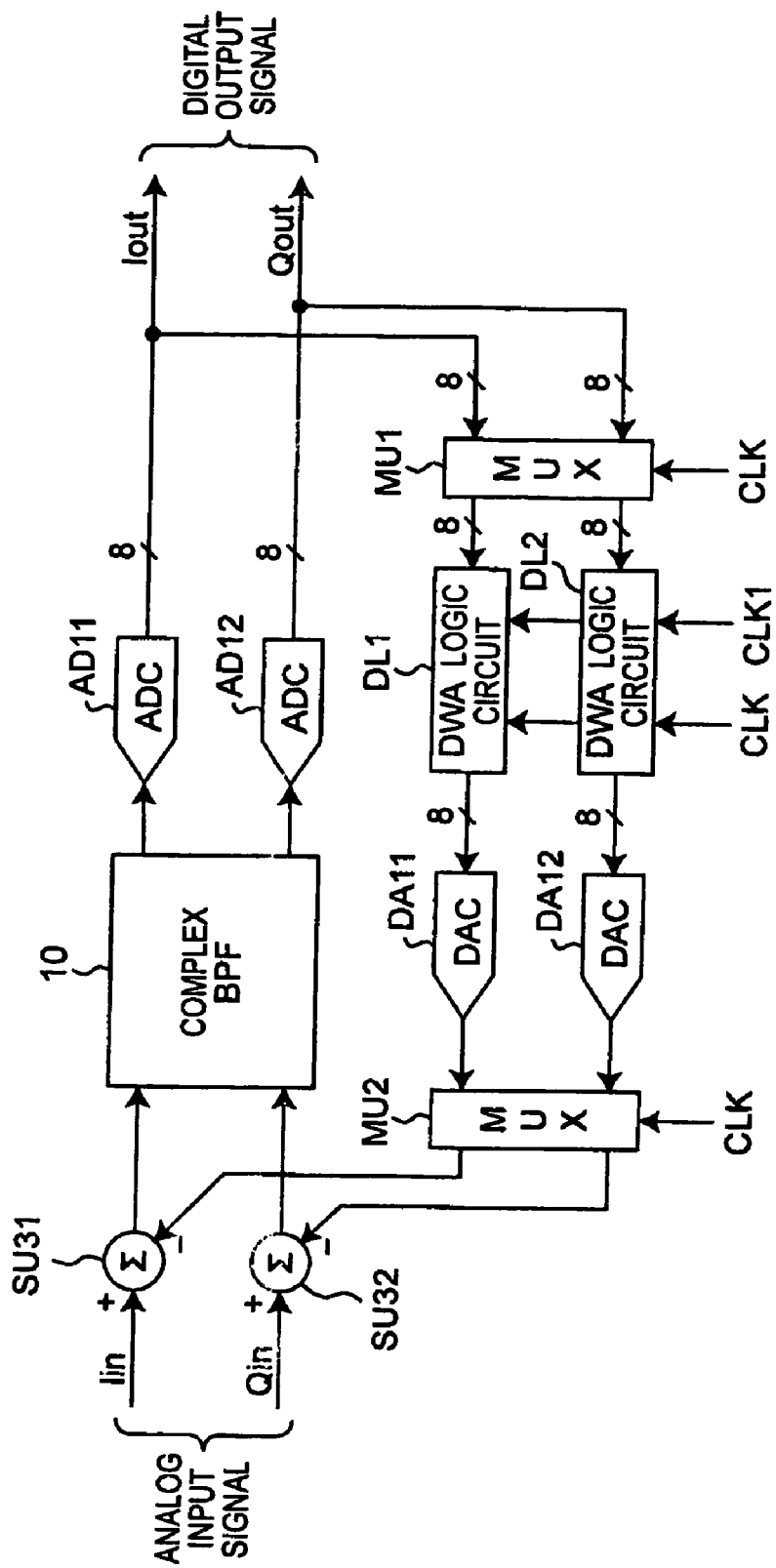

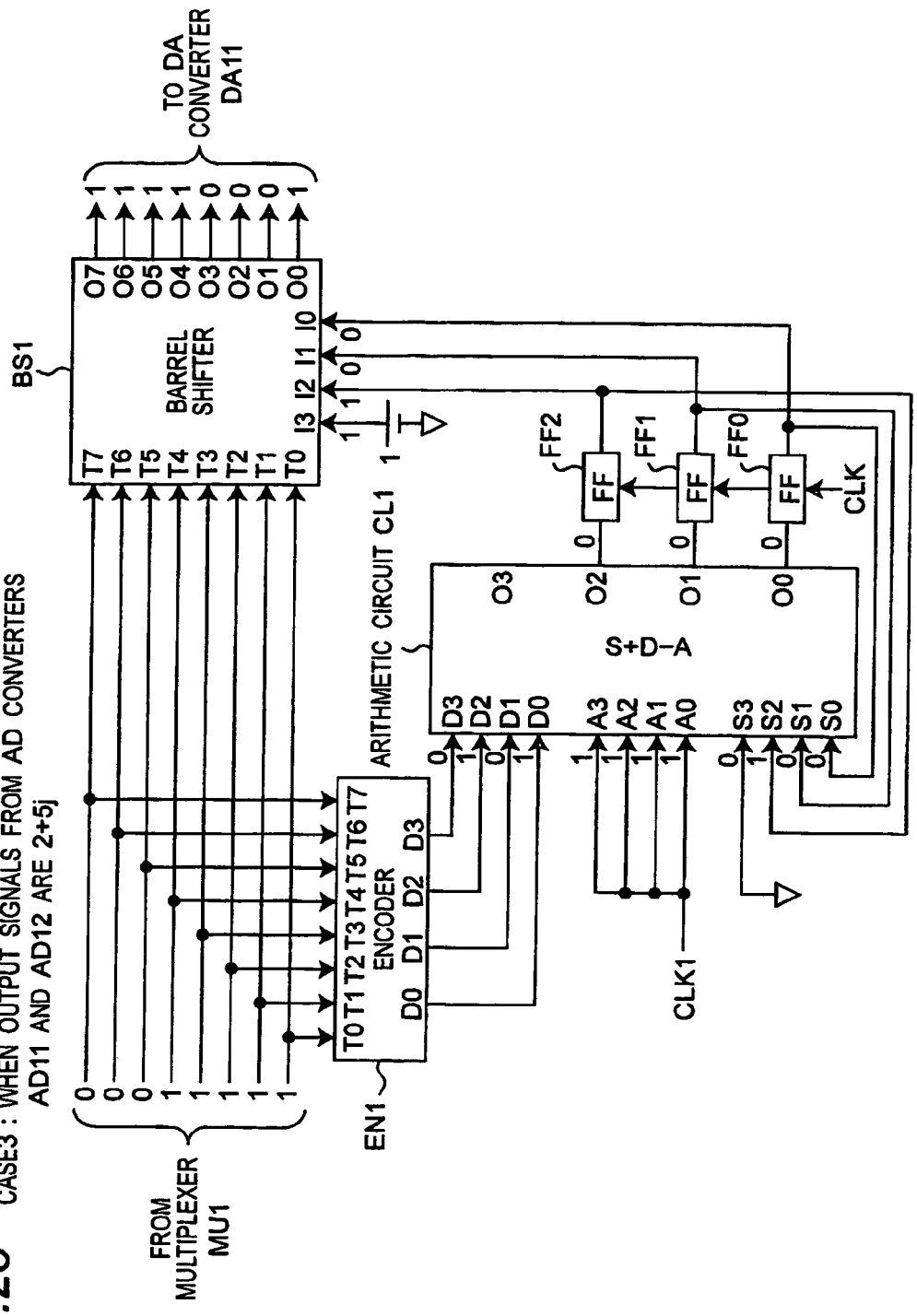

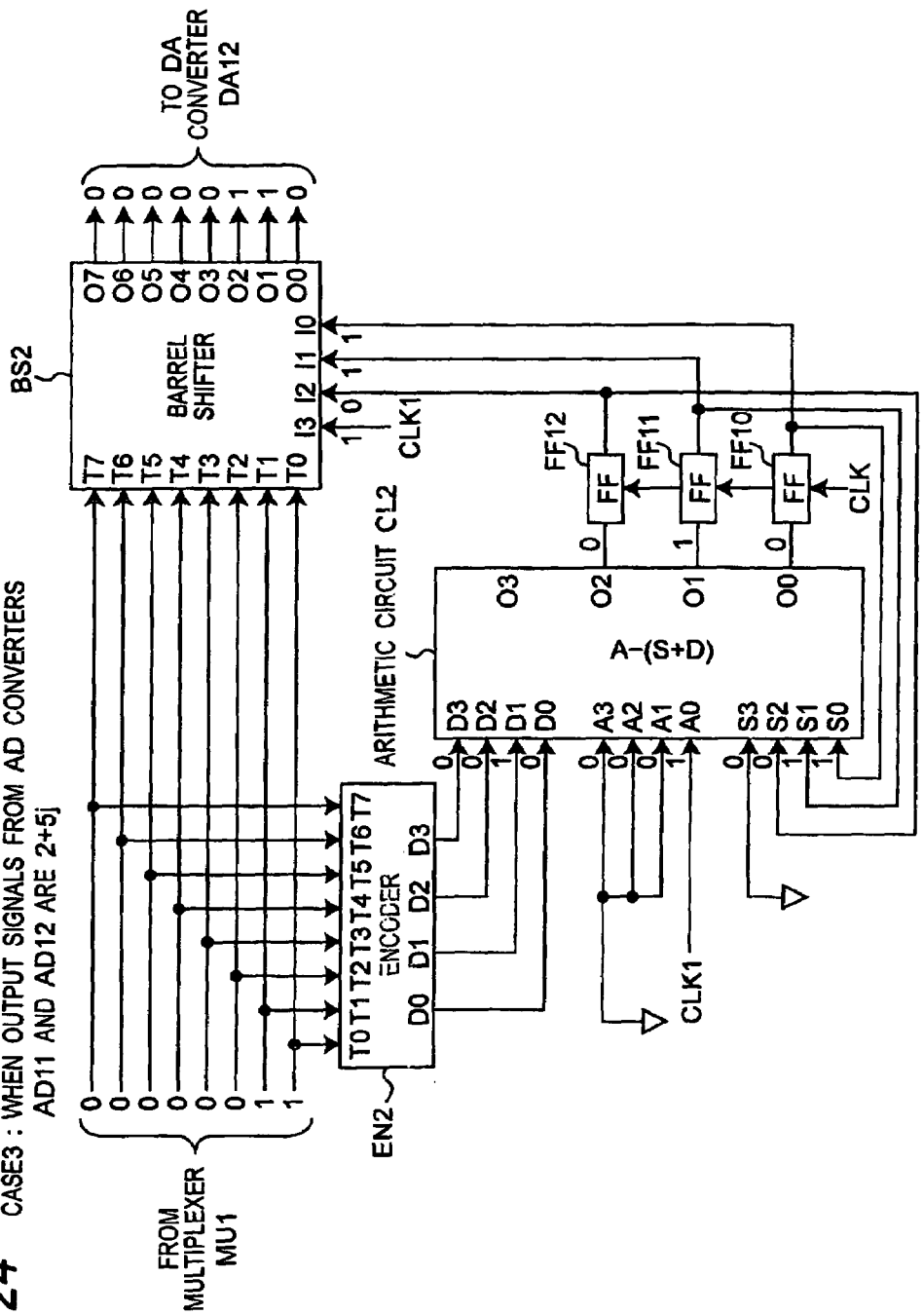

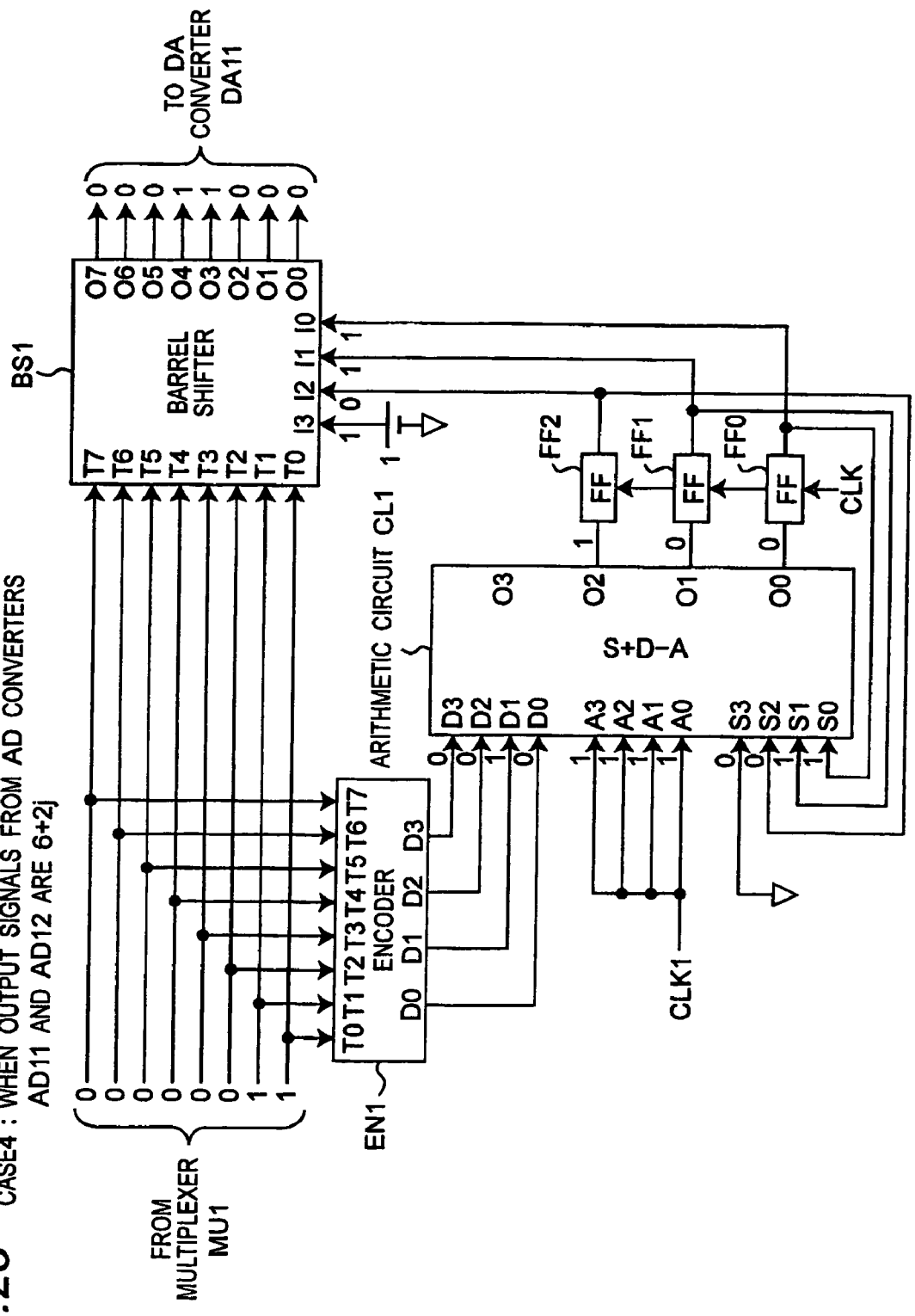

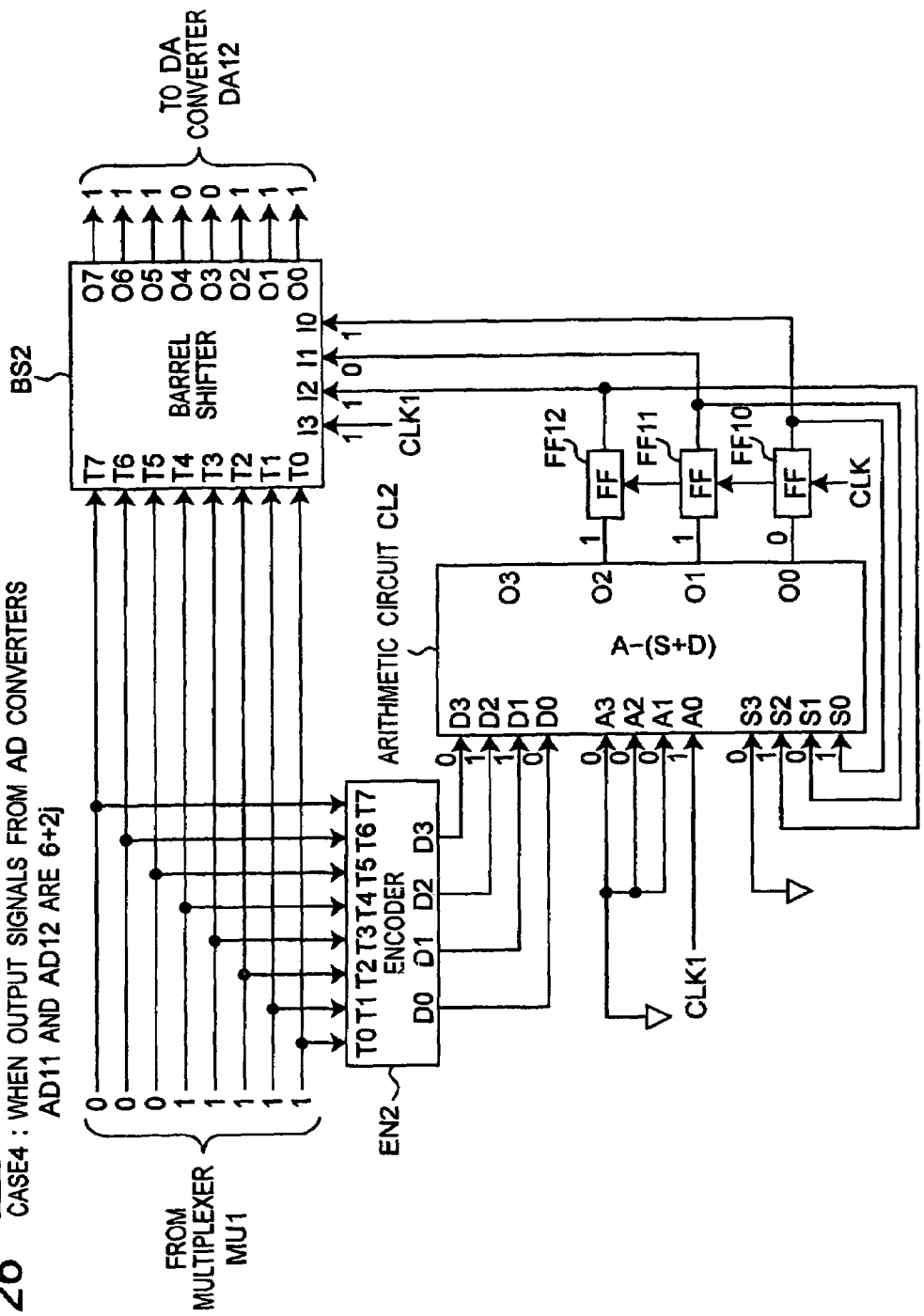

COMPLEX BAND-PASS ΔΣ AD MODULATOR FOR USE IN AD CONVERTER CIRCUIT

BACKGROUND OF THE INVENTION

1. Field of the Invention

The present invention relates to a complex band-pass ΔΣ AD modulator, an AD converter circuit, and a digital radio receiver, and in particular, to a complex band-pass ΔΣ AD modulator for use in a digital radio receiver or the like, an AD converter circuit using the complex band-pass ΔΣ AD modulator, and a digital radio receiver using the AD converter circuit.

2. Description of the Related Art

Application of a band pass ΔΣ AD converter to an RF receiver circuit in a communication system such as a mobile phone and a radio LAN has been under consideration (for example, See first to fifth non-patent documents). Further, in an application used in the communication system (in particular, Low-IF receiver), the application of a complex band-pass ΔΣ AD modulator capable of suppressing an image signal generated on the inside of the modulator due to a mismatch between I path and Q path has been also under consideration since the image signal deteriorates a characteristic of the system (for example, See first to sixth non-patent documents). In the RF receiver circuit, when an AD converter circuit can be provided so as be shifted in a direction closer to an antenna, complicated functions which were conventionally realized by analog circuits can be realized by means of a digital signal processing method, then this achieves improvement of an integrity and a performance of the entire system.

In order to realize that, superior linearity, dynamic range, signal band and ability to eliminate the image signal are required for the AD converter circuit. Since the complex band-pass ΔΣ modulator is capable of suppressing the level of the image signal generated therein, any influence from the mismatch generated between the I and Q signal paths can be reduced. The ΔΣ AD modulator realizes a higher precision by means of an oversampling method and a noise shaping method. In the case of using a higher-order one-bit ΔΣ modulator to further pursue the high precision, the stability is a bottleneck, and a modulator having a higher-filter-order (and a higher-order digital filter as provided with the modulator at the next stage or the subsequent stage) and a higher oversampling rate (referred to as an OSR hereinafter) are required (for example, See seventh non-patent documents). In this case, it is necessary to increase the sampling ratio to increase the OSR. On the other hand, when a multi-bit ΔΣ AD modulator is used, a high resolution can be obtained with a low OSR, and the problem of the stability can be reduced (for example, See seventh and eighth non-patent documents).

Documents related to the present invention are as follows:

(1) Japanese patent laid-open publication No. JP-05-275972-A (referred to as a first patent document hereinafter);

(2) Japanese patent laid-open publication No. JP-11-017549-A (referred to as a second patent document hereinafter);

(3) Japanese patent laid-open publication No. JP-2000-244323-A (referred to as a third patent document hereinafter);

(4) Japanese patent laid-open publication No. JP-2002-100992-A (referred to as a fourth patent document hereinafter);

(5) K. Philips, "A 4. 4 mW 76 dB complex ΣΔADC for Bluetooth receivers", ISSCC Digest of Technical Papers, Vol. 46, pp. 64–65, February 2003 (referred to as a first non-patent document hereinafter);

(6) F. Henkel et al., "A 1 MHz-bandwidth second-order continuous time quadrature band-pass sigma-delta modulator for low-IF radio receivers", IEEE Journal of Solid-State Circuits, Vol. 37, pp. 1628–1635, December 2002 (referred to as a second non-patent document hereinafter);

(7) F. Esfahani et al., "A fourth order continuous-time complex sigma-delta ADC for low-IF GSM and EDGE receivers", Symposium of VLSI Circuits, Digest of Technical Papers, pp. 75–78, June 2003 (referred to as a third non-patent document hereinafter);

(8) R. Schreier et al., "A 10–300 MHz IF-digitizing IC with 90–105 dB dynamic range and 15–333 kHz bandwidth", IEEE Journal of Solid-State Circuits, Vol. 37, pp. 1636–1644, December 2002 (referred to as a fourth non-patent document hereinafter);

(9) T. Salo et al., "A dual-Mode 80 MHz band-pass ΔΣ modulator for a GSM/WCDMA IF-receiver", ISSCC Digest of Technical Papers, Vol. 45, pp. 218–219, February 2002 (referred to as a fifth non-patent document hereinafter);

(10) S. A. Jantzi et al., "Quadrature band-pass ΔΣ modulator for digital radio", IEEE Journal of Solid-State Circuits, Vol. 32, pp. 1935–1949, December 1997 (referred to as a sixth non-patent document hereinafter);

(11) S. R. Norsworthy et al. (editors), "Delta-Sigma Data Converters, -Theory, Design, and Simulation", IEEE Press, 1997 (referred to as a seventh non-patent document hereinafter);

(12) T. Ueno et al., "A fourth-order band-pass Δ-Σ modulator using second order band-pass noise-shaping dynamic element matching", IEEE Journal of Solid-State Circuits, Vol. 37, pp. 809–816, July 2002 (referred to as an eighth non-patent document hereinafter);

(13) T. Shui et al., "Mismatch shaping for a current-mode multibit delta-sigma DAC", IEEE Journal of Solid-State Circuits, Vol. 34, pp. 331–338, March 1999 (referred to as a ninth non-patent document hereinafter);

(14) L. R. Carley, "A noise-shaping coder topology for 15 bit converters", IEEE Journal of Solid-State Circuits, Vol. 24, pp. 267–273, April, 1989 (referred to as a tenth non-patent document hereinafter);

(15) E. Fogleman et al., "A 3.3-V single-poly CMOS audio ADC delta-sigma modulator with 53.8-dB peak SINAD and 105-dB peak SFDR", IEEE Journal of Solid-State Circuits, Vol. 35, pp. 297–307, March 2000 (referred to as an eleventh non-patent document hereinafter);

(16) R. Schreier et al., "Speed vs. dynamic range trade-off in oversampling data converters", in C. Toumazou et al. (editors), Trade-Offs in Analog Circuit Design, The Designer's Companion, Kluwer Academic Publishers, pp. 644–653, 2002 (referred to as a twelfth non-patent document hereinafter);

(17) Y. Yang et al., "A 114 dB 68 mW chopper-stabilized stereo multi-bit audio A/D converter", ISSCC Digest of Technical Papers, Vol. 46, pp. 56–57, February 2003 (referred to as a thirteenth non-patent document hereinafter);

(18) B. Razavi, "Principles of Data Converter Design", IEEE Press, 1995 (referred to as a fourteenth non-patent document hereinafter);

(19) A. Swaminathan, "A single-IF receiver architecture using a complex SD modulator", Master of Engineering thesis, Carleton University, Ottawa, Ontario, Canada, 1997 (referred to as a fifteenth non-patent document hereinafter);

(20) D. B. Barkin et al., "A CMOS oversampling bandpass cascaded D/A converter with digital FIR and current-mode semi-digital filtering", Symposium of VLSI Circuits, Digest of Technical Papers, pp. 79–82, June 2003 (referred to as a sixteenth non-patent document hereinafter);

(21) H. San et al, "A noise-shaping algorithm of multi-bit DAC non-linearities used in complex band-pass ΔΣ AD modulators", Circuit and System Workshop at Karuizawa by the Institute of Electronics, Information and Communication Engineers in Japan, published by the Institute of Electronics, Information and Communication Engineers, in Japan, pp. 85–90, April 2003 (referred to as a seventeenth non-patent document hereinafter);

(22) H. San et al., "An Element Rotation Algorithm for Multi-bit DAC Nonlinearities in Complex Band-pass Delta-Sigma AD Modulators", IEEE 17$^{th}$ International Conference on VLSI Design, Mumbai, India, pp. 151–156, January 2004 (referred to as an eighteenth non-patent document hereinafter);

(23) H. San et al., "A noise-shaping algorithm of multi-bit DAC nonlinearities in complex band-pass ΔΣ modulators", IEICE Transactions on Fundamentals, Vol. E87-A, No. 4, pp. 792–800, April 2004 (referred to as a nineteenth non-patent document hereinafter); and

(24) M. Miller, "Introduction to Sigma-Delta data converters", IEEE 2003 Custom Integrated Circuits Conference, Educational Sessions, San Jose, U.S.A., September 2003 (referred to as a twentieth non-patent document hereinafter).

However, in contrast to the one-bit DA converter having a superior linearity, it is not possible for a non-linearity of an internal DA converter of a multi-bit ΔΣ AD modulator to be noise-shaped on the inside of the modulator, and this leads to disadvantageous deterioration in the precision of the entire AD converter. These problems will be described in detail below.

FIG. 2A is a block diagram showing a configuration of a band-pass ΔΣ AD modulator according to a prior art. FIG. 2B is an equivalent block diagram of the band-pass ΔΣ AD modulator of FIG. 2A.

Referring to FIG. 2A, the band-pass ΔΣ AD modulator includes a subtracter SU1, a band-pass filter BP1, an AD converter AD1, and a DA converter DA1. In FIG. 2A, Ain denotes an analog input signal, and Dout denotes a digital output signal. In the equivalent block diagram of FIG. 2B, the band-pass ΔΣ AD modulator includes the subtracter SU1, a band-pass filter TR1 having a transfer function H (z), and adders SM1 and SM2. In FIG. 2B, X (z) denotes the analog input signal, Y (z) denotes the digital output signal, E (z) denotes a quantization error of the AD converter AD1, and δ (z) denotes a non-linearity error of the DA converter DA1. A relationship between the input and output signals can be represented by the following Equations:

$$M(z) = \frac{H(z)}{1+H(z)}\left[X(z) + \frac{1}{H(z)}E(z) + \frac{1}{H(z)}\delta(z)\right], \text{ and} \quad (1)$$

$$Y(z) = \frac{H(z)}{1+H(z)}\left[[X(z)] + \frac{1}{H(z)}E(z) - \delta(z)\right]. \quad (2)$$

A signal component S (z) and a noise component N (z) are defined as follows:

$$S(z) \equiv \frac{H(z)}{1+H(z)}X(z), \text{ and} \quad (3)$$

-continued
$$N(z) \equiv \frac{H(z)}{1+H(z)}\left[\frac{1}{H(z)}E(z) - \delta(z)\right].$$

It is clearly understood from the Equation (3) that the quantization noise E (z) of the internal AD converter AD1 is noise-shaped, however, the non-linearity error δ (z) of the DA converter DA1 is not noise-shaped and directly outputted, and this leads to that it is difficult to realize a ΔΣ AD converter of a higher precision.

In order to noise-shape the non-linearity of the internal multi-bit DA converter DA1 of the band-pass ΔΣ AD modulator, algorithms such as a dynamic element matching method (for example, See the eighth non-patent document) and an element rotation method (for example, See the ninth non-patent document) were proposed. However, those methods can only be applied to a real band-pass ΔΣ AD modulator having a single input terminal and a single output terminal, as shown in FIGS. 2A and 2B.

Next, a noise-shaping algorithm for noise-shaping a non-linearity of a conventional DA converter for use in a real modulator having a single input terminal and an output terminal using the element rotation method will be described. A first-order noise-shaping algorithm for first-order noise-shaping the non-linearities of DA converters which are provided in low-pass and high-pass modulators each having a single input terminal and a single output terminal is also used in a noise-shaping algorithm for a complex band-pass modulator.

FIG. 3 is a circuit diagram showing a configuration of a DA converter of nine-level precision segment current cell type according to the prior art. A relationship between the DA converter of segment type and a mismatch value in respective current cells will be described. In the DA converter of segment current cell type having a conventional nine-level resolution includes eight unit current cells CS0 to CS7, and a resistance R, as shown in FIG. 3. When a current applied to a k-th current cell CSk is defined as $I_k$ (k=0, 1, 2, . . . , 7), all of the currents $I_k$ are equal to each other in an ideal state. On the other hand, the current values of the respective current cells are different from each other due to variation in the processes upon manufacturing an IC chip. The current values of the respective current cells are represented by the following Equations:

$$I_k \equiv I + e_k \ (k=0, 1, 2, \ldots, 7),$$

$$I \equiv (I_0+I_1+I_2+ \ldots +I_7)/8,$$

and $$e_0+e_1+e_2+ \ldots +e_7=0,$$

where $e_k$ in the above Equation denotes mismatch values in the current values $I_k$ due to the above mentioned reason. When a digital input signal is m, and the current cells CS0, CS1, CS2, . . . , CSm-1 are turned on, then the output voltage from the DA converter is represented by the following Equation:

$$V_{out}=mRI+\delta.$$

The non-linearity δ of the DA converter is given by the following Equation:

$$\delta=R(e_0+e_1+e_2+ \ldots +e_{m-1}).$$

An influence caused by the mismatch values $e_0, e_1, \ldots, e_7$ (or, equivalently, the non-linearity δ of the DA converter)

on the output power spectrum of the AD converter is generated in a substantially flat shape within a signal band.

Next, a low-pass element rotation method disclosed in, for example, the twelfth non-patent document, will be described. FIG. 4A is a block diagram showing a configuration of a DA converter circuit using the low-pass element rotation method according to the prior art. FIG. 4B is an equivalent block diagram of the DA converter circuit of FIG. 4A.

The DA converter circuit shown in FIG. 4A includes a digital low-pass filter TR11 having a transfer function $(1/(1-z^{-1}))$, a DA converter DA2 having a non-linearity $\delta(z)$, and an analog high-pass filter TR12 having a transfer function $(1-z^{-1})$, which are connected in a form of cascade. In this case, the digital low-pass filter TR11 of FIG. 4A includes an adder SM11, and a delay circuit DE11 for feeding back an output signal from the adder SM11 to the adder SM11, as shown in FIG. 4B. Further, the analog high-pass filter TR12 of FIG. 4A includes a subtracter SU11, and a delay circuit DE12 for delaying an output signal from the DA converter DA2 by a predetermined time length and thereafter outputting a delayed signal to the subtracter SU11, as shown in FIG. 4B. The respective signals C1 to C4 are represented by the following Equations:

$$C_2(z)=(1/(1-z^{-1}))C_1(z) \quad (4);$$

$$C_4(z)=(1-z^{-1})C_3(z) \quad (5); \text{ and}$$

$$C_3(z)=C_2(z)+\delta(z) \quad (6).$$

Therefore, the analog output $C_4(z)$ is represented by the following Equation:

$$C_4(z)=C_1(z)+(1-z^{-1})\delta(z) \quad (7)$$

The non-linearity $\delta(z)$ of the DA converter DA2 is subjected to a first-order noise-shaping by the digital low-pass filter TR11 having a transfer function $(1-z^{-1})$. Further, the following Equations can be obtained from the Equations (4), (5) and (6):

$$C_2(n+1)=C_2(n)+C_1(n+1) \quad (8);$$

$$C_4(n+1)=C_3(n+1)-C_3(n) \quad (9); \text{ and}$$

$$C_3(n)=C_2(n)+\delta(n) \quad (10).$$

The non-linearity $\delta(z)$ of the DA converter DA2 could be noise-shaped if it was possible to replace the multi-bit DA converter DA2 on the inside of the low-pass $\Delta\Sigma$ AD modulator by the circuit shown in FIGS. 4A and 4B. However, it is actually impossible to realize such a circuit. For example, when the signal $C_1(n)$ is always a positive integer of 2, the input signal $C_2(n)$ inputted to the DA converter DA2 is infinite according to increase of a timing "n" and eventually exceeds an input range of the DA converter DA2, and this leads to that it impossible to accurately realize the DA conversion. The low-pass element rotation algorithm was proposed in order to solve the above-mentioned problems and can equivalently realize the circuit. The following is proposed for the DA converter of segment current cell type.

(A) The respective current cells are arranged in a ring shape in the DA converter of segment current cell type according to the prior art, as shown in FIG. 5.

(B) A pointer for storing a position of the turned-on current cell is provided in the DA converter circuit. When the pointer is set to P (n) at the timing "n", the P (n)-th current cell is selected for the input data at a next sampling timing "n+1".

When it is assumed that the number of the current cells is infinite, and also the following Equations are assumed:

$$C_2(n)=a,$$

and $$C_1(n+1)=b (0 \leq b \leq 8),$$

then the current cells CS0, CS1, . . . , CS (a+b−1) of the DA converter DA2 are turned on. In this case, the following Equations are obtained from the Equations (8) and (10):

$$C_3(n+1)=(a+b)RI+R(e_0+e_1+e_2+ \ldots +e_{a+b-1}).$$

Further, because of the following Equation:

$$C_3(n)=aRI+R(e_0+e_1+e_2+ \ldots +e_{a-1}),$$

the analog signal $C_4(n+1)$ of the DA converter DA2 is represented by the following Equation:

$$C_4(n+1)=C_3(n+1)-C_3(n)=bRI+R(e_{a-1}+e_a+e_{a+1}+ \ldots +e_{a+b-1}).$$

Concretely speaking, the current cells CS (a−1), CSa, CS (a+1), . . . , CS (a+b−1) of the DA converter are turned on. In the present example, there is a possibility that a+b−1>7. However, since the actual DA converter is provided with only eight current cells, the current cells CS $(\text{mod}_8(a-1))$, CS $(\text{mod}_8(a))$, CS $(\text{mod}_8(a+1))$, . . . , CS $(\text{mod}_8(a+b-1))$ as arranged in a ring shape are turned in the case of applying the low-pass element rotation algorithm. In this specification, in place of a general notation "x modulo y" or "x mod y", which show a remainder as obtained when "x" is divided by "y", a simplified notation thereof, "$\text{mod}_y x$" is used for the description. An operation of the low-pass element rotation algorithm will be described in detail as follows:

(a) It is assumed that the input data is $C_1(n)=c_n$ (n=0, 1, 2, 3, . . . ) at the timing "n";

(b) The number "$c_n$" of current cells CS $(\text{mod}_8 (P(n)+1))$, CS $(\text{mod}_8 (P(n)+2))$, CS $(\text{mod}_8 (P(n)+3))$, . . . , $\text{mod}_8 (P(n)+c_n)$ are turned on; and (c) At the timing "n+1", the pointer P (n+1) is set as follows:

$$P(n+1)=\text{mod}_8 (P(n)+c_n).$$

FIG. 6 shows current cells (hatched parts) which are turned on when the input data changes as 4, 3, 2, 2, 5, . . . in the case of noise-shaping a non-linearity of 3-bit segment type DA converter using the low-pass noise-shaping element rotation method according to the prior art.

Referring to FIG. 6, when the input signal is "4" at the timing "n", the current cells CS0, CS1, CS2 and CS3 are turned on. Next, when the input signal is "3" at the timing "n+1", the current cells CS4, CS5 and CS6 are turned on. When the input signal is "2" at a timing "n+2", the current cells CS7 and CS0(=$\text{mod}_8$ (8)) are turned on. Further, when the input signal is "2" at a timing "n+3", the current cells CS1 (=$\text{mod}_8$ (9)) and CS2 (=$\text{mod}_8$ (10)) are turned on in a manner similar to that of above. When the current cells which were turned on are thus selected clockwise, the mismatch in the current cells (that is the non-linearity of the DA converter) is subjected to the first-order noise-shaping (for example, See the eleventh to thirteenth non-patent documents). The inventors of the present invention carried out simulations using a software of MATLAB (registered trademark), and it was confirmed that a power spectrum of the non-linearity of the DA converter was shown in the flat shape in the signal band when the conventional DA converter of segment type was used, however, the non-linearity was first-order-noise-shaped in the case of using the above-mentioned algorithm.

Next, a high-pass element rotation method as disclosed in, for example, the ninth non-patent document, will be described below. FIG. 7A is a block diagram showing a configuration of a DA converter circuit using the high-pass element rotation method according to the prior art. FIG. 7B is an equivalent block diagram of the DA converter circuit of FIG. 7A.

The DA converter circuit shown in FIG. 7A includes a digital high-pass filter TR21 having a transfer function $(1/(1+z^{-1}))$, a DA converter DA3 having a non-linearity $\delta(z)$, and an analog low-pass filter TR22 having a transfer function $(1-z^{-1})$, which are connected in a form of cascade. The digital high-pass filter TR21 of FIG. 7A includes a subtracter SR21, and a delay circuit DE21 for feeding back an output signal from the subtracter SR21 to the subtracter SU21, as shown in FIG. 7B. The analog low-pass filter TR22 of FIG. 7A includes an adder SM21, and a delay circuit DE22 for delaying an output signal from the DA converter DA3 by a predetermined time length and thereafter outputting a delayed output signal to the adder SM21, as shown in FIG. 7B. A relationship among respective signals D1 to D4 is represented by the following Equations:

$$D_2(z)=(1/1+z^{-1})D_1(z) \quad (11),$$

$$D_4(z)=(1/1+z^{-1})D_3(z) \quad (12),$$

and $$D_3(z)=D_2(z)+\delta(z) \quad (13).$$

Therefore, the analog output signal $D_4(z)$ is represented by the following Equation:

$$D_4(z)=D_1(z)+(1+z^{-1})\delta(z).$$

The non-linearity $\delta(z)$ of the DA converter DA3 is subjected to the first-order noise-shaping by the analog low-pass filter TR22 having a transfer function $(1+z^{-1})$. Further, the following Equations are obtained from the Equations (11), (12) and (13):

$$D_2(n+1)=D_2(n)-D_1(n+1) \quad (15);$$

$$D_4(n+1)=D_3(n+1)+D_3(n) \quad (16);$$

and $$D_3(n)=D_2(n)+\delta(z) \quad (17).$$

If it was possible to replace the multi-bit DA converter on the inside of the high-pass $\Delta\Sigma$ AD modulator by the circuit shown in FIGS. 7A and 7B, the non-linearity of the DA converter could be noise-shaped, however, such a circuit cannot be realized in a manner similar to that of the low-pass $\Delta\Sigma$ AD modulator. Accordingly, the high-pass element rotation algorithm was proposed and can equivalently realize the circuit. It is assumed that the current cells are arranged in the ring shape and the pointer is provided in the DA converter of segment current cell type. An operation of the high-pass element rotation algorithm will be described in detail as follows:

(a) At a timing "2n":
(a1) The input data is $D_1(2n)=d_{2n}$.
(a2) The number "$d_{2n}$" of current cells CS (P(2n)), CS (mod$_8$ (P(2n)+1)), CS (mod$_8$ (P(2n)+2)), ..., CS (mod$_8$ (P(2n)+$d_{2n}$−1)) are turned on. Concretely speaking, the number "$d_{2n}$" of current cells are turned on starting from the P(2n)-th current cell and shifting in the clockwise direction.
(a3) The pointer at a timing "2n+1" is set to P(2n+1)= mod$_8$ (P(2n)+$d_{2n}$−1).

(b) At the timing "2n+1":
(b1) The input data is $D_1(2n+1)=d_{2n+1}$.
(b2) The number "$d_{2n+1}$" of current cells CS (P(2n+1)), CS (mod$_8$ (P(2n+1)−1)), CS (mod$_8$ (P(2n+1)−2)), ..., CS (mod$_8$ (P(2n+1)−$d_{2n+1}$+1)) are turned on. Concretely speaking, the number "$d_{2n+1}$" of current cells are turned on, starting from the P(2n+1)-th current cell and shifting in the counterclockwise direction.
(b3) The pointer P(2n+2) at a timing "(2n+2)" is set as follows:

$$P(2n+2)=\text{mod}_8 (P(2n+1)-d_{2n+1}+1).$$

FIG. 8 shows the current cells which are turned on when the input data changes as 4, 3, 2, 6, 5, ... in the case of noise-shaping the non-linearity of the DA converter of 3-bit segment type using the high-pass noise-shaping element rotation method according to the prior art.

Referring to FIG. 8, when the input data is "4" at the timing "n", the current cells CS0, CS1, CS2 and CS3 are turned on. Next, when the input data is "3" at the timing "n+1", the current cells CS3, CS2 and CS1 are turned on. When the input data is "2" at the timing "n+2", the current cells CS1 and CS2 are turned on. Further, when the input data is "6" at the timing "n+3", the current cells CS2, CS1, CS0, CS7, CS6 and CS5 are turned on in a manner similar to that of above. More concretely, the direction in which the current cells are turned on is alternately changed between the clockwise and counterclockwise directions every time when the sampling timing changes.

As mentioned above, the input and output relationship in the band-pass $\Delta\Sigma$ AD modulator having the configuration of FIGS. 2A and 2B is represented by the Equation (2). It is understood from the Equation (2) that the quantization noise E (z) of the internal AD converter is noise-shaped, however, the non-linearity error $\delta(z)$ of the DA converter DA3 is not subjected to the noise shaping and directly outputted, and this leads to that it is difficult to realize the $\Delta\Sigma$ AD converter achieving a higher precision. More concretely, the DA converter of multi-bit type includes the non-linearity resulting from a matching precision generated in the device, which adversely affects the performance of the entire AD converter circuit. In particular, there is caused an even more serious problem when a refining process is adopted in order to downsize and accelerate the circuit. Although the AD converter circuit using the complex band-pass $\Delta\Sigma$ modulator was proposed in the first to fourth patent documents, the proposed AD converter circuit can not solve any mentioned problems.

SUMMARY OF THE INVENTION

An essential object of the present invention is therefore to provide a complex band-pass $\Delta\Sigma$ AD modulator having a simpler configuration and achieving a higher speed as compared with those of the prior art.

Another object of the present invention is to provide an AD converter circuit using the complex band-pass $\Delta\Sigma$ AD modulator, and a digital radio receiver using the AD converter circuit.

In order to achieve the aforementioned objective, according to one aspect of the present invention, there is provided a complex band-pass $\Delta\Sigma$ AD modulator including a subtracter device, a complex band-pass filter, first and second AD converters, and DA converters. The subtracter device subtracts a DA converted complex analog signal from first and second DA converters, from a complex analog signal including inputted first and second analog signals orthogonal to each other, and outputs a subtracted complex analog signal. The complex band-pass filter band-pass-filters the subtracted complex analog signal and outputs a band-pass-filtered complex analog signal. The first and second AD converters AD converts the band-pass-filtered complex analog signal into an AD converted complex digital signal including first and second digital signals orthogonal to each other, and outputs the AD converted complex digital signal. The first and second DA converters DA converts the AD converted complex digital signal into the DA converted complex analog signal, and outputs the DA converted complex analog signal to the subtracter device.

The complex band-pass ΔΣ AD modulator further includes first and second multiplexers, and first and second logic circuits. A clock signal has a predetermined period of time, and has first and second timings as alternately generated.

At the first timing, the first multiplexer inputs and outputs the first and second digital signals from the first and second AD converters to the first and second logic circuits, respectively, and at the second timing, inputs the first and second digital signals from the first and second AD converters, and outputs the first digital signal to the second logic circuit and outputs the second digital signal to the first logic circuit. The first and second logic circuits substantially noise-shapes non-linearities of the first and second DA converters by realizing a complex digital filter as virtually provided at a previous stage of the first and second DA converters and a complex analog filter as virtually provided at the next stage of the first and second DA converters, using a high-pass element rotation method for the first digital signal and a low-pass element rotation method for the second digital signal. At the first timing, the second multiplexer inputs and outputs the first and second digital signals from the first and second DA converters as first and second DA converted analog signals to the subtracter device, respectively, and at the second timing, inputs the first and second digital signals from the first and second DA converters, and outputs the first digital signal as a second DA converted analog signal to the subtracter device and outputs the second digital signal as a first DA converted analog signal to the subtracter device.

In the above-mentioned complex band-pass ΔΣ AD modulator, each of the first and second logic circuits preferably includes a arithmetic circuit, and a barrel shifter. The arithmetic circuit executes a predetermined calculation on an inputted digital signal, and outputs a calculated value. The barrel shifter shifts the inputted digital signal by a shift amount of the calculated value calculated by the arithmetic circuit, and outputs a shifted digital signal.

In the above-mentioned complex band-pass ΔΣ AD modulator, the arithmetic circuit of the first logic circuits operates in synchronization with the clock signal having the period, calculates a sum of the inputted digital signal and a digital signal outputted from the arithmetic circuit one period prior to a current timing to be processed, subtracts a digital signal having a minimum value and a maximum value which are alternately changed over per the clock signal from a calculated sum, and outputs the calculated value of a subtracted value. The barrel shifter of the first logic circuit operates in synchronization with the clock signal having the period, has a ring shape of a predetermined number of bits, shifts the inputted digital signal counterclockwise by the shift amount of the calculated value, and outputs a shifted digital signal. The arithmetic circuit of the second logic circuit operates in synchronization with the clock signal having the period, subtracts a sum of the inputted digital signal and the digital signal outputted from the arithmetic circuit one period prior to the current timing to be processed from a digital signal having a value of "1" and "0" which are alternately changed over per the clock signal, and outputs the calculated value of a subtracted value. The barrel shifter of the second logic circuit operates in synchronization with the clock signal having the period, has a ring shape of a predetermined number of bits, shifts the inputted digital signal by the shift amount of the calculated value in a direction of clockwise and counterclockwise which are alternately changed over per the clock signal, and outputs a shifted digital signal.

In the above-mentioned, complex band-pass ΔΣ AD modulator, each of the first and second logic circuits preferably further includes an encoder for encoding the inputted digital signal having a further code different from a binary code so as to generate a digital signal of the binary code and outputting an encoded digital signal to the arithmetic circuit.

In the above-mentioned complex band-pass ΔΣ AD modulator, the further code is preferably a thermometer code.

According to another aspect of the present invention, there is provided an AD converter circuit including the complex band-pass ΔΣ AD modulator, and a decimation circuit for performing a digital complex band-pass filtering by executing a predetermined decimation process on the digital signal outputted from the complex band-pass ΔΣ AD modulator.

According to a further aspect of the present invention, there is provided a digital radio receiver for receiving an analog radio signal and outputting a digital signal. The digital radio receiver includes the AD converter circuit.

According to the complex band-pass ΔΣ AD modulator of the present invention, there can be provided the complex band-pass ΔΣ AD converter circuit and the digital radio receiver using the same having a simpler configuration and executing a process at a speed higher than that of the prior art. More concretely, the DWA algorithm capable of applying a first-order noise shaping to a non-linearity of the DA converter of the multi-bit complex band-pass ΔΣ AD modulator for processing first and second signals orthogonal to each other can be realized by means of hardware circuit by additionally supplying a relatively small-size digital circuit and an analog multiplexer to the hardware circuit. Accordingly, reductions in power consumption and chip area can be realized in, for example, Bluetooth and a Low-IF receiver of broad-band LAN or the like.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 4A is a block diagram showing a configuration of a DA converter circuit using a low-pass element rotation method according to the prior art;

FIG. 4B is an equivalent block diagram of the DA converter circuit of FIG. 4A;

FIG. 5 is a circuit diagram showing a configuration of a DA converter of segment type according to the prior art, in which current cells are arrayed in a ring shape.

FIG. 15 is a block diagram of a detailed configuration of the complex band-pass ΔΣ AD modulator 7 according to the preferred embodiment of the present invention;

FIG. 23 is a block diagram showing an operation of the DWA logic circuit DL1 of FIG. 16 in a case 3;

FIG. 24 is a block diagram showing an operation of the DWA logic circuit DL2 of FIG. 17 in the case 3;

FIG. 25 is a block diagram showing an operation of the DWA logic circuit DL1 of FIG. 16 in a case 4; and FIG. 26 is a block diagram showing an operation of the DWA logic circuit DL2 of FIG. 17 in the case 4.

DETAILED DESCRIPTION OF THE PREFERRED EMBODIMENTS

Preferred embodiments according to the present invention will be described below with reference to the attached drawings. In the description below, components similar to each other are denoted by the same numerical references.

Figure 1:
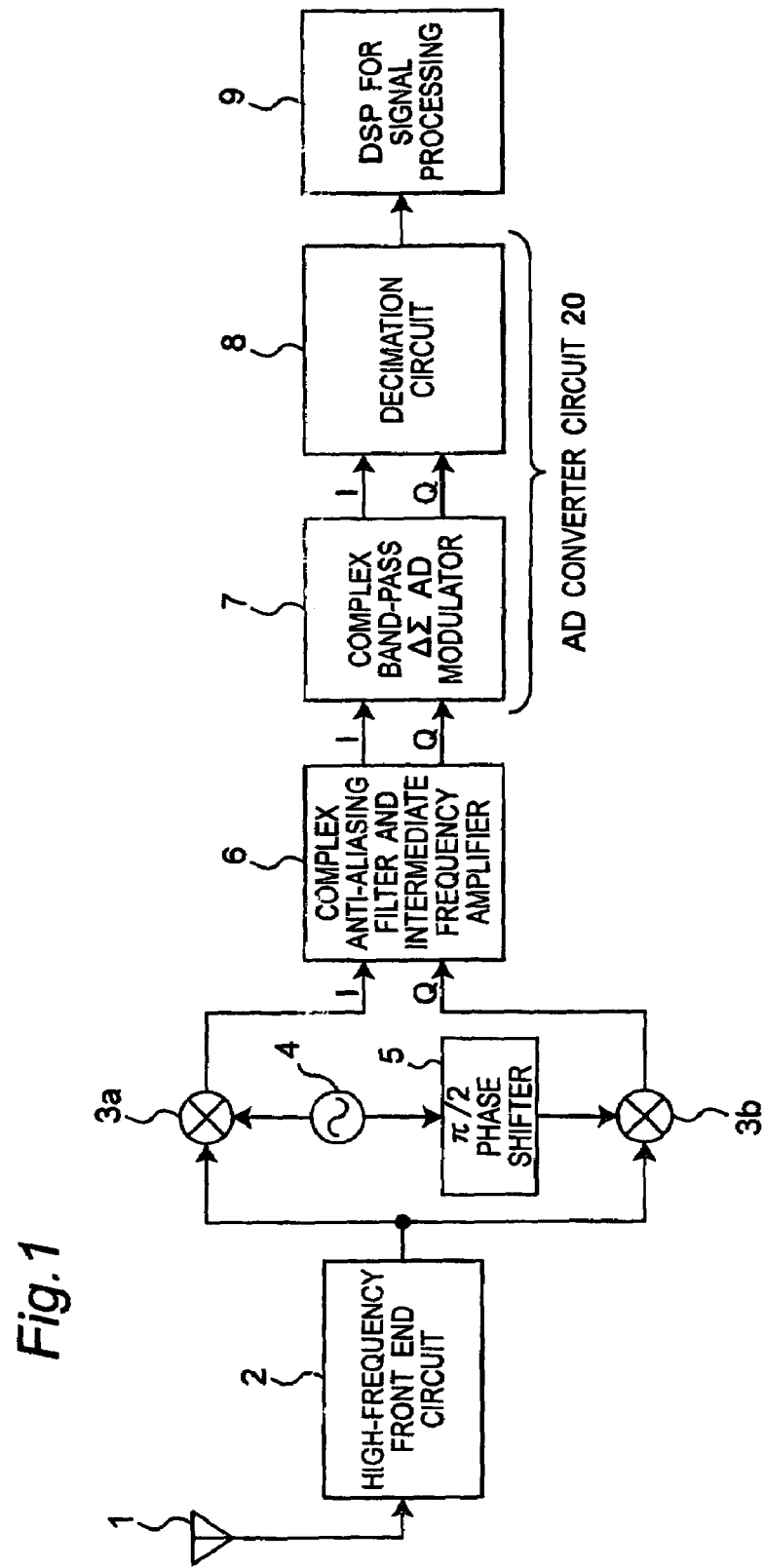
FIG. 1 is a block diagram showing a configuration of a digital radio receiver having an AD converter circuit 20 including a complex band-pass ΔΣ AD modulator 7, and a decimation circuit 8, according to a preferred embodiment of the present invention.
Figure 2A:
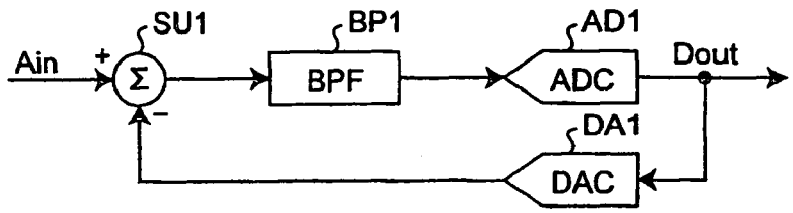
FIG. 2A is a block diagram showing a configuration of a band-pass ΔΣ AD modulator according to a prior art.
Figure 2B:
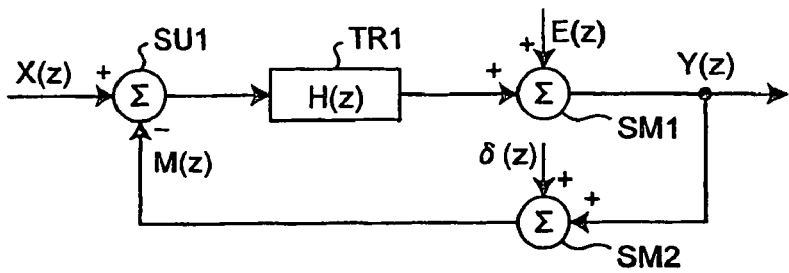
FIG. 2B is an equivalent block diagram of the band-pass ΔΣ AD modulator of FIG. 2A.
Figure 3:
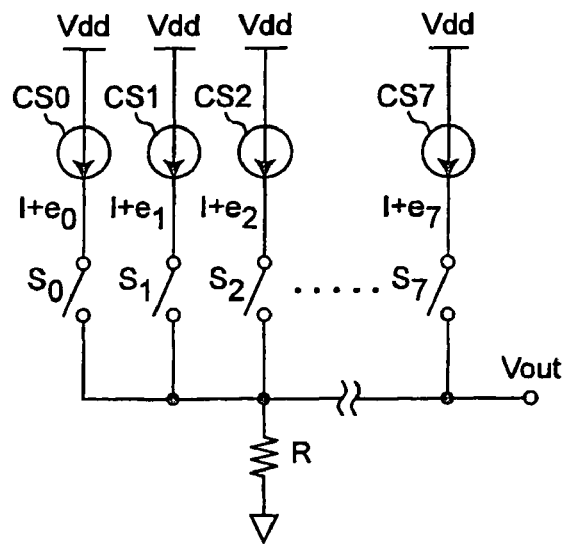
FIG. 3 is a circuit diagram showing a configuration of a DA converter of nine-level precision segment current cell type according to the prior art.
Figure 6:
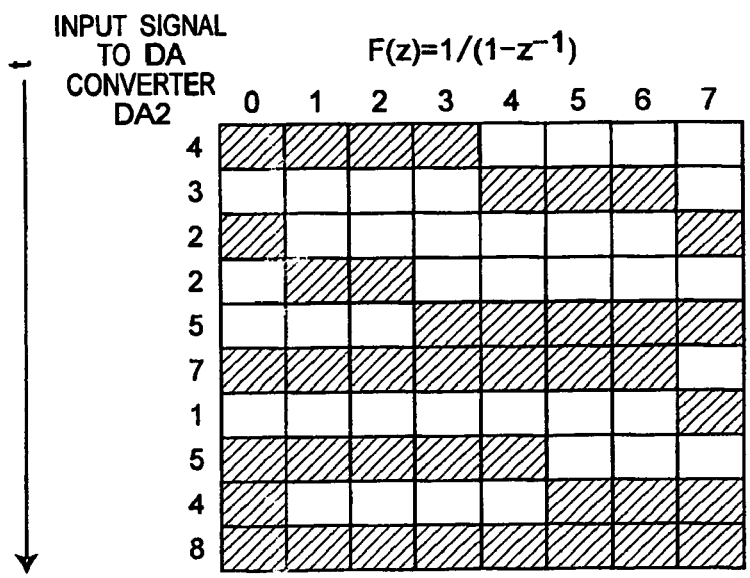
FIG. 6 shows current cells which are turned on when input data changes as 4, 3, 2, 2, 5, . . . in the case of noise-shaping a non-linearity of 3-bit segment type DA converter using the low-pass noise-shaping element rotation method according to the prior art.

FIG. 1 is a block diagram showing a configuration of a digital radio receiver having an AD converter circuit 20 including a complex band-pass ΔΣ AD modulator 7, and a decimation circuit 8, according to a preferred embodiment of the present invention. A digital radio receiver according to the present embodiment is characterized by including a complex band-pass ΔΣ AD modulator 7 of FIG. 15 as described later. In particular, in the present embodiment, in order to realize the complex band-pass ΔΣ AD modulator achieving a higher precision using an algorithm capable of noise-shaping non-linearities of internal multi-bit DA converters DA11 and DA12 of the complex band-pass ΔΣ AD modulator 7 in which an I signal and a Q signal are used as input and output signals, the non-linearities of the multi-bit DA converters DA11 and DA12 can be noise-shaped by additionally providing a small-size digital circuit. More concretely, the present embodiment is characterized in that the algorithm is realized by a hardware circuit by adding a relatively small-size digital circuit and analog multiplexers.

Referring to FIG. 1, a radio signal received by an antenna 1 is subjected to processes such as a low-noise high-frequency amplification by a high-frequency front end circuit 2, and then, is divided into two radio signals. The divided two radio signals are inputted to mixers 3a and 3b, respectively. On the other hand, a local oscillator 4 generates a local oscillation signal having a predetermined local oscillation frequency, and outputs the local oscillation signal to the mixer 3a, and also, outputs the local oscillation signal to the mixer 3b via a π/2 phase shifter 5. The mixer 3a mixes the inputted two signals, and makes a mixed I signal pass through a complex anti-aliasing filter of a band-pass filter and an intermediate frequency amplifier 6 so as to extract an analog intermediate frequency I signal, which is outputted to the complex band-pass ΔΣ AD modulator 7. The mixer 3b mixes the inputted two signals, and makes a mixed Q signal (which is orthogonal to the mixed I signal) pass through a complex anti-aliasing filter of a band-pass filter and the intermediate frequency amplifier 6 so as to extract an analog intermediate frequency Q signal, which is outputted to the complex band-pass ΔΣ AD modulator 7.

The complex band-pass ΔΣ AD modulator 7 AD-converts an analog intermediate frequency signal including the analog intermediate frequency I signal and the analog intermediate frequency Q signal into a digital intermediate frequency signal including a digital intermediate frequency I signal and a digital intermediate frequency Q signal, using the complex band-pass ΔΣ AD modulator, and outputs the AD-converted signal to the decimation circuit 8. The decimation circuit 8 performs a complex band-pass filtering by executing a predetermined decimation process on the inputted digital intermediate frequency signal, and then, outputs a processed digital signal to a digital signal processor (DSP) 9 for signal processing. The decimation circuit 8 includes a digital filter circuit, converts a low-bit and high-speed rate digital signal having, for example, three bits and a bit rate of 20 Mbps into a high-bit and low-speed rate digital signal having, for example, 12 bits and a bit rate of 1 kbps, and outputs the same signal. The complex band-pass ΔΣ AD modulator 7 and the decimation circuit 8 constitute the AD converter circuit 20. Further, in the signal-processing digital signal processor 9, the inputted digital signal is subjected to processes such as clock reproduction and demodulation so as to generate a demodulated data signal.

Next, based on the element rotation method using the low-pass filter and the high-pass filter, derivation of an element rotation algorithm used in the complex band-pass modulator according to the present embodiment will be described.

Figure 9:
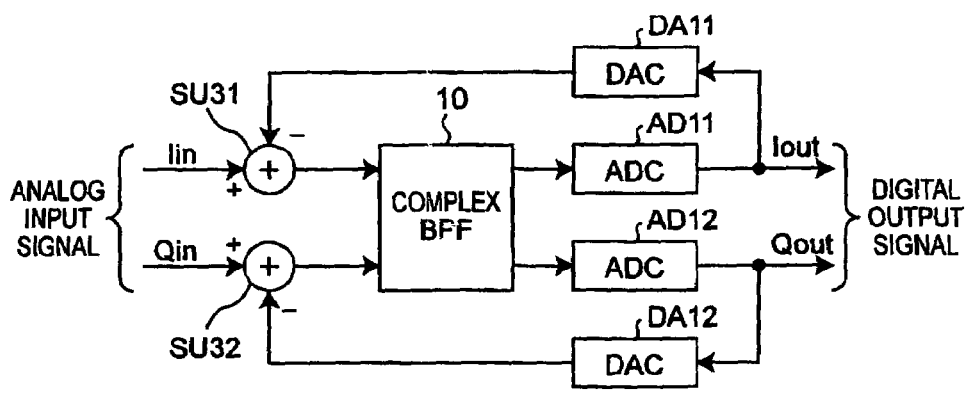
FIG. 9 is a block diagram showing a detailed configuration of a band-pass ΔΣ AD modulator 7A according to the preferred embodiment of the present invention.
Figure 10:
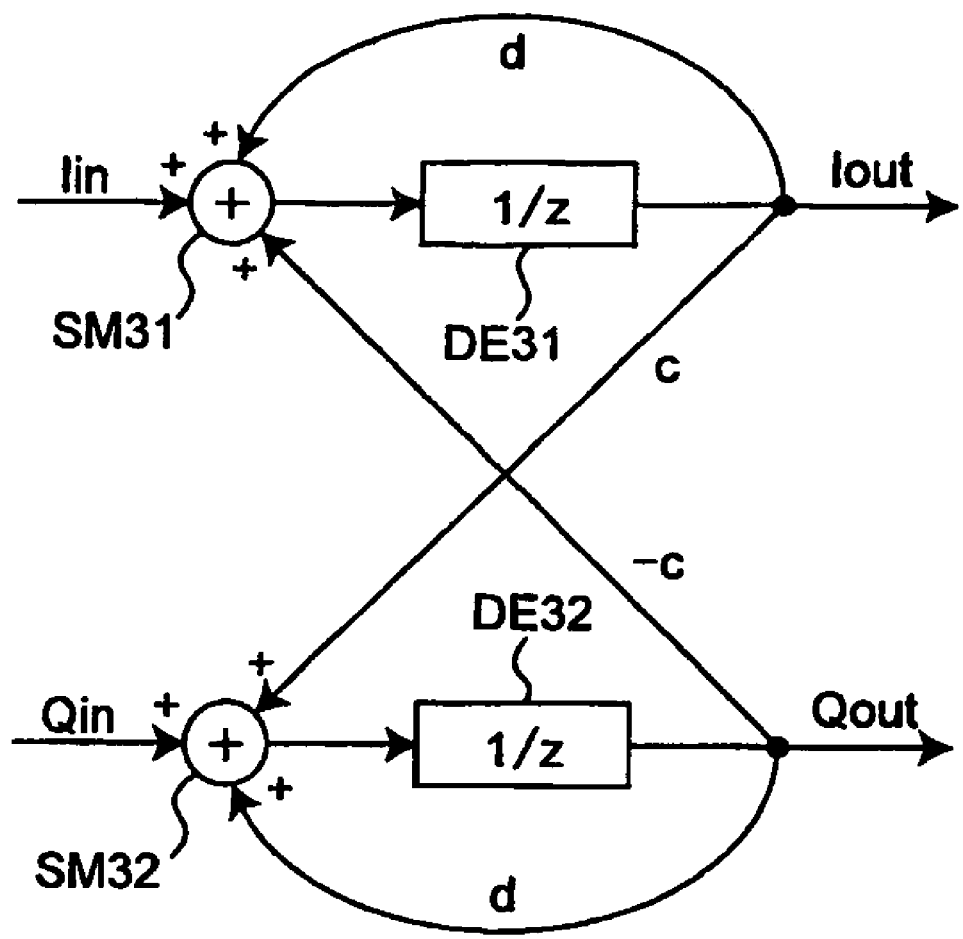
FIG. 10 is an equivalent block diagram of a complex band-pass filter 10 shown in FIG. 9.
Figure 11:
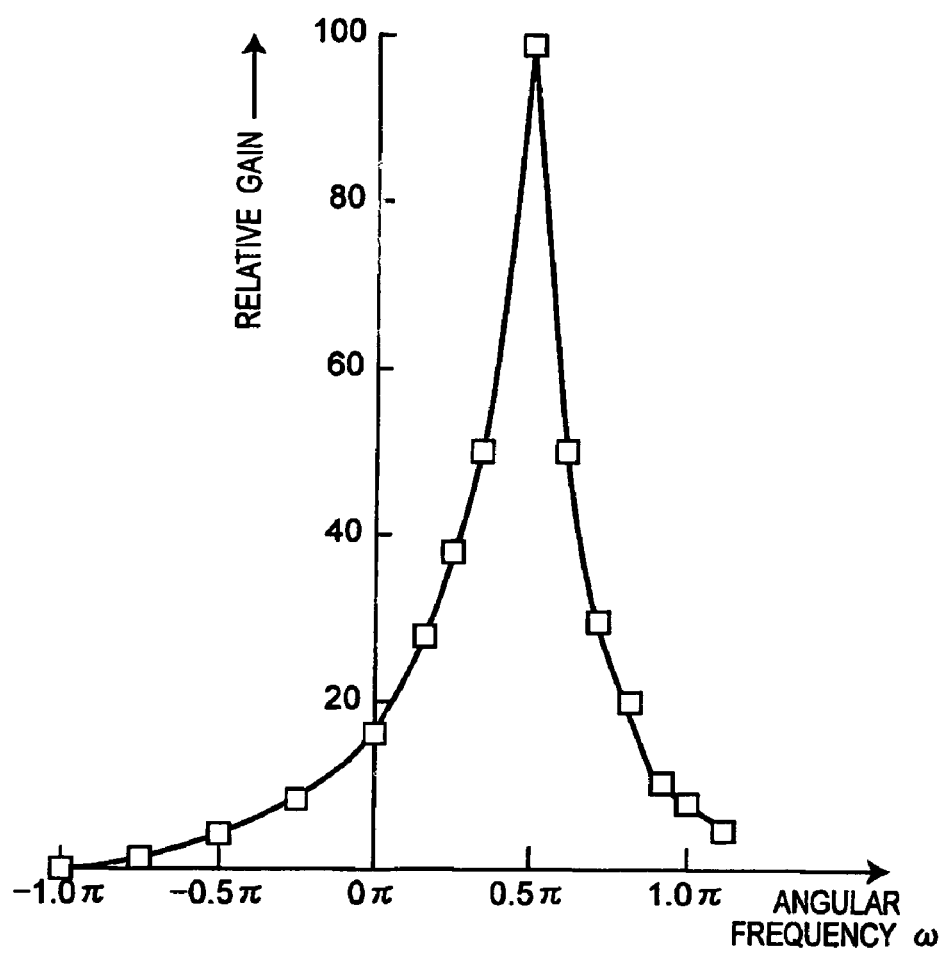
FIG. 11 is a graph showing an angular frequency characteristic of a relative gain of the complex band-pass filter 10 shown in FIG. 10.

FIG. 9 is a block diagram showing a detailed configuration of a band-pass ΔΣ AD modulator 7A according to the preferred embodiment of the present invention. FIG. 10 is an equivalent block diagram of a complex band-pass filter 10 shown in FIG. 9. FIG. 11 is a graph showing an angular frequency characteristic of a relative gain of the complex band-pass filter 10 shown in FIG. 10.

Referring to FIG. 9, the complex band-pass ΔΣ AD modulator 7A includes two subtracters SU31 and SU32, two AD converters AD11 and AD12, two DA converters DA11 and DA12, and the complex band-pass filter 10 of a first-order complex integrator.

Referring again to FIG. 9, an I signal Iin, which is an analog input signal, is inputted to the subtracter SU31. The subtracter SU31 subtracts an output signal from the DA converter DA11, from the inputted I signal Iin, and then, outputs a signal having subtraction results to the AD converter AD11 via the complex band-pass filter 10 having a configuration of FIG. 10. The AD converter AD11 AD-converts the inputted signal into an I signal Iout, which is a digital output signal, and then, outputs the same I signal Iout to the DA converter DA11. The DA converter DA11 DA-converts the inputted signal, and outputs the DA-converted signal to the subtracter SU31. A Q signal Qin, which is an analog input signal, is inputted to the subtracter SU32. The subtracter SU32 subtracts an output signal from the DA converter DA12, from the inputted Q signal Qin, and outputs a signal having subtraction results to the AD converter AD12 via the complex band-pass filter 10. The AD converter AD12 AD-converts the inputted signal into a Q signal Qout, which is a digital output signal, and outputs the same Q signal Qout to the DA converter DA12. The DA converter DA12 DA-converts the inputted signal, and outputs the DA-converted signal to the subtracter SU32.

Referring to FIG. 10, the complex band-pass filter 10 includes two adders SM31 and SM32, and two delay circuits DE31 and DE32. A transfer function H (z) of the complex band-pass filter 10 shown in FIG. 10 of a complex integrator is represented by the following Equation:

$$H(z) = \frac{1}{z - (d + jc)},$$

where "c" and "d" in the above Equation denote design parameters, which show polarities of the complex integrator (for example, See the sixth non-patent document). A gain characteristic of the complex integrator shown in FIG. 11 does not show symmetry on an axis of angular frequency ω=0, and is characterized in that the gain is at the maximum level with a normalization angular frequency ω=π/2 (corresponding to ¼ of a sampling frequency) and an image signal (corresponding to ω=−π/2) is suppressed.

Figure 12:
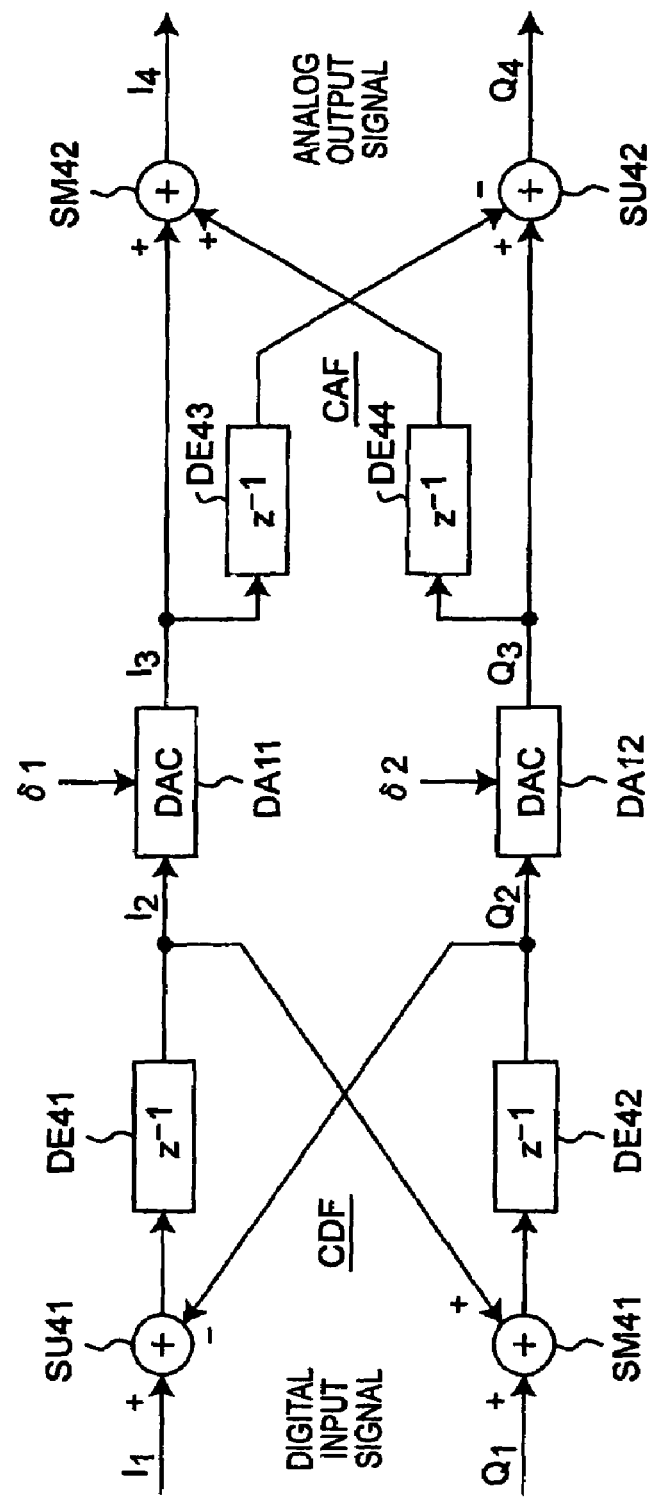
FIG. 12 is an equivalent block diagram showing a configuration of a DA converter circuit of complex band-pass ΔΣ AD modulator type when non-linearities of DA converters are noise-shaped.

Next, a configuration required for noise-shaping the non-linearities of the DA converters DA11 and DA12 using the complex band-pass filter will be described below. FIG. 12 is an equivalent block diagram showing a configuration of the DA converter circuit when the non-linearities of the DA converters DA11 and DA12 are noise-shaped.

The configuration in which the non-linearities of the DA converters DA11 and DA12 are noise-shaped using the complex band-pass filter, which is shown in FIG. 12, includes the two DA converters DA11 and DA12, a complex digital filter CDF as inserted at a previous stage of the DA converters DA11 and DA12, and a complex analog filter CAF as inserted at the next stage of the DA converters DA11 and DA12. In FIG. 12, $I_1$ and $Q_1$ denote digital output signals from the AD converters of I and Q channels, respectively, and $I_4$ and $Q_4$ denote analog output signals from the DA converters of the I and Q channels, respectively. A transfer function of the complex digital filter CDF as inserted at the previous stage of the DA converters DA 1 and DA12 is set to the following Equation:

$$F(z) = 1/(z-j).$$

In this case, a transfer function of the complex analog filter CAF as inserted at the next stage of the DA converters DA11 and DA12 is set to 1/F (z). Further, a complex multi-bit output signal of the AD converters of the two channels is defined by the following Equation:

$$Y(z) = I_1(z) + jQ_1(z).$$

Furthermore, a feedback signal to the complex band-pass filter 10 is defined by the following Equation:

$$M(z) = I_4(z) + jQ_4(z).$$

In this case, a relationship represented by the following Equations can be obtained in FIG. 12:

$$I_2(z) + jQ_2(z) = F(z) \cdot Y(z) \quad (18),$$

$$I_3(z) + jQ_3(z) = (I_2(z) + jQ_2(z)) + (\delta_1 + j\delta_2) \quad (19),$$

and $$M(z) = (1/F(z))(I_3 + jQ_3) \quad (20).$$

When the Equations (18) and (19) are substituted into the Equation (20), the following Equation is obtained:

$$M(z) = Y(z) + (1/F(z))(\delta_1(z) + j\delta_2) \quad (21).$$

When the Equation (21) is substituted into the Equation (1), the following Equation is obtained:

$$N(z) = \frac{1}{H(z)}[E(z) - (\delta_1(z) + j\delta_2(z))].$$

In the Equations (1) and (2), assuming that H (z) is a transfer function of the complex band-pass filter, and X (z), Y (z), E (z) and δ(z) are the complex signals, the above-mentioned Equations can be also applied to the complex band-pass ΔΣ AD modulator. Therefore, when the Equation (21) is substituted into the Equation (1), the following Equation can be obtained:

$$N(z) = \frac{H(z)}{1+H(z)}\left[\frac{1}{H(z)}E(z) - \frac{1}{F(z)}(\delta_1(z)+j\delta_2(z))\right]. \quad (22)$$

Comparing the Equation (22) with the Equation (3), it is understood that not only the complex quantization noise E (z) of the AD converters of the two channels AD11 and AD12 but also the non-linearity error $(\delta_1+j\delta_2)$ of the AD converters of the two channels AD11 and AD12 is noise-shaped with 1/F (z).

Next, the algorithm used in the present embodiment will be described in detail as follows. The following Equations are obtained from FIG. 12:

$$I_2(n+1)=I_1(n)-Q_2(n) \quad (23),$$

$$I_4(n+1)=I_3(n+1)+Q_3(n) \quad (24),$$

$$I_3(n)=I_2(n)+\delta_1(n) \quad (25),$$

$$Q_2(n+1)=I_2(n)+Q_1(n) \quad (26),$$

$$Q_4(n+1)=Q_3(n+1)-I_3(n) \quad (27),$$

and $$Q_3(n)=Q_2(n)+\delta_2(n) \quad (28).$$

The input signals $I_2$ and $Q_2$ inputted to the two DA converters DA11 and DA12 may be beyond an input range of the two DA converters DA11 and DA12, and this leads to making it impossible to directly realize the configuration shown in FIG. 12. For example, when the input signals $I_2$ and $Q_2$ are represented by the following Equation based on the conditions that the normalization frequency in the center of the signal band in the modulator is $\omega=\pi/2$:

$$I_1(n)+jQ_1(n)=\exp(j(\pi/2)n)+4.$$

Then the following Equations can be obtained from the Equations (23) and (26):

$$I_2(1)=5-Q_2(0),$$

$$I_2(2)=I_2(0),$$

$$I_2(3)=-7+Q_2(0),$$

and $$I_2(4)=I_2(0),$$

. . .

$$Q_2(1)=-4+I_2(0),$$

$$Q_2(2)=10-Q_2(0),$$

$$Q_2(3)=4-I_2(0),) \text{ and}$$

$$Q_2(4)=-4+Q_2(0),$$

. . . .

It is obvious that the values of the input signals $I_2$ and $Q_2$ of the two DA converters DA11 and DA12 are beyond the input range (0 to 8) of the DA converters. In order to solve the problem, below is proposed an algorithm capable of equivalently realizing the configuration by adding the digital filter at the previous stage of the two DA converters DA11 and DA12, and by eliminating any requirement to provide the analog filter at the next stage of the two DA converters DA11 and DA12.

Figure 13:
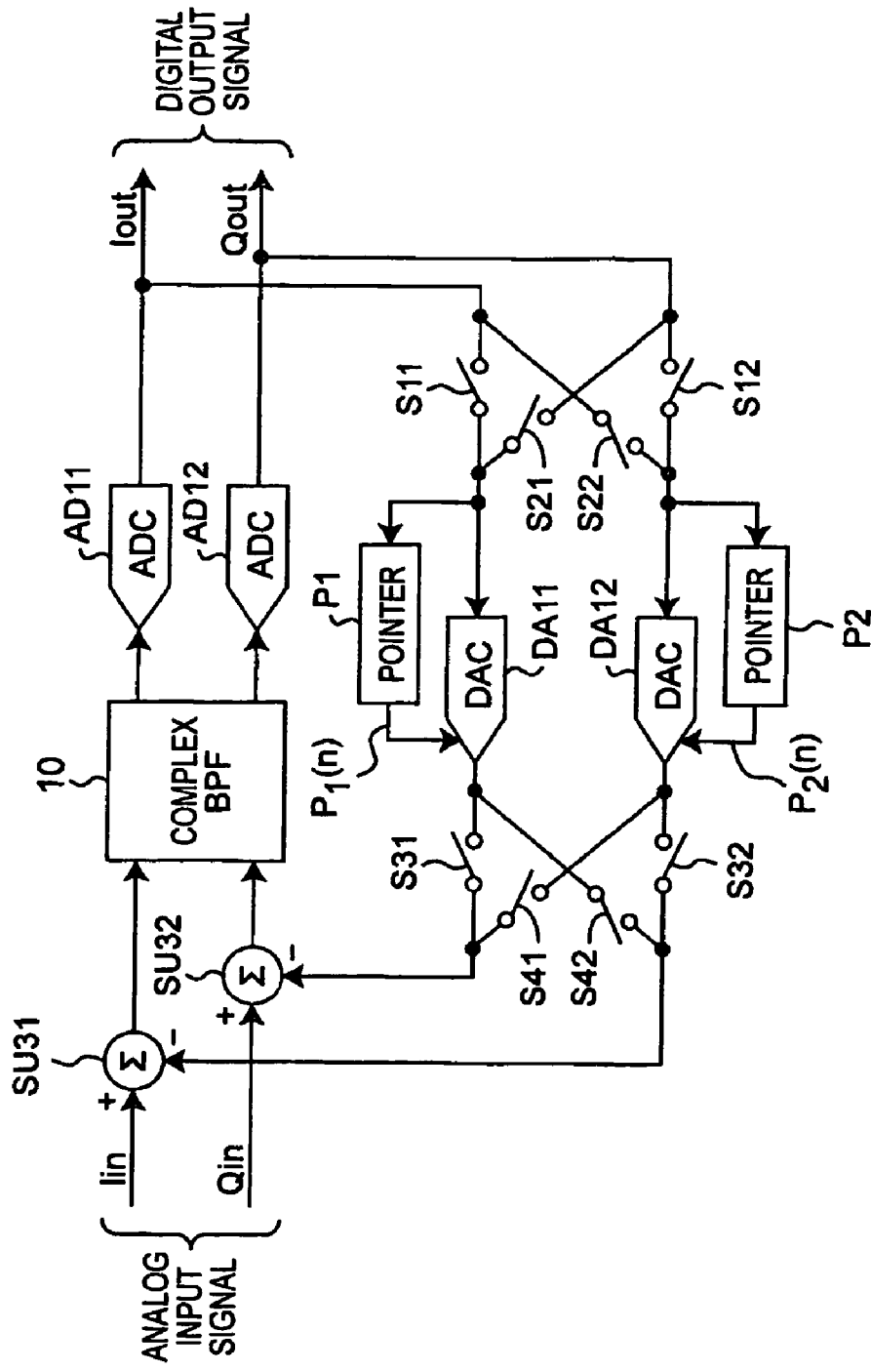
FIG. 13 is a block diagram of a configuration of a complex band-pass ΔΣ AD modulator 7B according to the preferred embodiment of the present invention.

FIG. 13 is a block diagram of a configuration of a complex band-pass ΔΣ AD modulator 7B according to the preferred embodiment of the present invention. The followings are proposed for the two DA converters DA11 and DA12 of segment type, as shown in FIG. 13.

(A) The current cells of the respective DA converters DA11 and DA12 are arrayed in the ring shape, as shown in FIG. 5. As described later, four switches S11, S12, S21 and S22 are provided at the previous stage of the DA converters DA11 and DA12. On the other hand, switches S31, S32, S41 and S42 are provided at the next stage of the DA converters DA11 and DA12 so that the processes of the I and Q signals are alternately executed by the respective DA converters DA11 and DA12 with a predetermined period or cycle.

(B) The pointers P1 and P2 are provided in the respective arrays of the current cells in the DA converters DA11 and DA12. At the timing "n", an indicated value as indicated by the pointer P1 of the DA converter DA11 is set to $P_1$ (n). On the other hand, an indicated value as indicated by the pointer P2 of the DA converter DA12 is set to $P_2$ (n) so that positions of the current cells selected at the next timing "n+1" are stored.

An operation of the equivalent algorithm will be described below.

(A) At the timing "2n":

(A1) When the input signal of the I-channel DA converter is $I_1$ (2n)=$i_{2n}$:

(A1-1) The $(P_1(2n))$-th, $(\text{mod}_8 (P_1(2n)+1))$-th, ..., $(\text{mod}_8 (P_1(2n)+i_{2n}-1))$-th current cells are turned on in the DA converter DA11. In other words, the number "$i_{2n}$" of current cells are selectively turned on, starting from the $(P_1(2n))$-th current cell and changing or shifting in the clockwise direction.

(A1-2) The output signal from the DA converter DA11 becomes $I_4(2n)$.

(A1-3) The indicated value as indicated by the pointer P1 of the DA converter DA11 at the next timing "2n+1" is set as follows:

$$P_1(2n+1)=\text{mod}_8(P_1(2n)+i_2n-1).$$

(A2) When the input signal of the Q-channel DA converter DA12 is $Q_1$ (2n)=$q_{2n}$:

(A2-1) The $(\text{mod}_8 (P_2(2n)+1))$-th, $(\text{mod}_8 (P_2(2n)+2))$-th, ..., $(\text{mod}_8 (P_2(2n)+q_{2n}))$-th current cells are turned on in the DA converter DA12. In other words, the number "$q_{2n}$" of current cells are turned on, starting from the $(P_2(2n)+1)$-th current cell and changing or shifting in the clockwise direction.

(A2-2) The output signal from the DA converter DA12 becomes $Q_4(2n)$.

(A2-3) The indicated value as indicated by the pointer P2 of the DA converter DA12 at the next timing "2n+1" is set as follows:

$$P_2(2n+1)=\text{mod}_8(P_2(2n)+q_{2n}).$$

(B) At the timing "2n+1":

(B1) When the input signal of the I-channel DA converter DA12 is $I_1$ (2n+1)=$i_{2+1}$:

(B1-1) The $(P_2(2n+1))$-th, $(\text{mod}_8 (P_2(2n+1)-1))$-th, ..., $(\text{mod}_8 (P_2(2n+1)-i_{2n+1}+1))$-th current cells are turned on in the DA converter DA12. In other words, the number "$i_{2n+1}$" of current cells are selectively turned on, starting from the $(P_2(2n+1))$-th current cell and changing or shifting in the counterclockwise direction.

(B1-2) The output signal from the DA converter DA12 becomes $I_4(2n+1)$.

(B1-3) The indicated value as indicated by the pointer P2 of the DA converter DA12 at the next timing "2n+2" as follows:

$$P_2(2n+2)=mod_8(P_2(2n+1)-i_{2n+1}+1).$$

(B2) When the input signal of the Q-channel DA converter DA12 is $Q_1(2n+1)=q_{2n+1}$:

(B2-1) The $(mod_8 (P_1(2n+1)+1)$-th, $(mod_8 (P_1(2n+1)+2))$-th, ..., $(mod_8 (P_1(2n+1)+q_{2n+1}))$-th current cells are turned on in the DA converter DA11. In other words, the number "$q_{2n+1}$" of current cells are selectively turned on, starting from the $(mod_8 (P_1(2n+1)+1))$-th current cell and changing or shifting in the clockwise direction.

(B2-2) The output signal from the DA converter DA11 becomes $Q_4(2n+1)$.

(B2-3) The indicated value as indicated by the pointer P1 of the DA converter DA11 at the next timing "2n+2" as follows:

$$P_1(2n+2)=mod_8(P_1(2n+1)+q_{2n+1}).$$

Figure 14A:
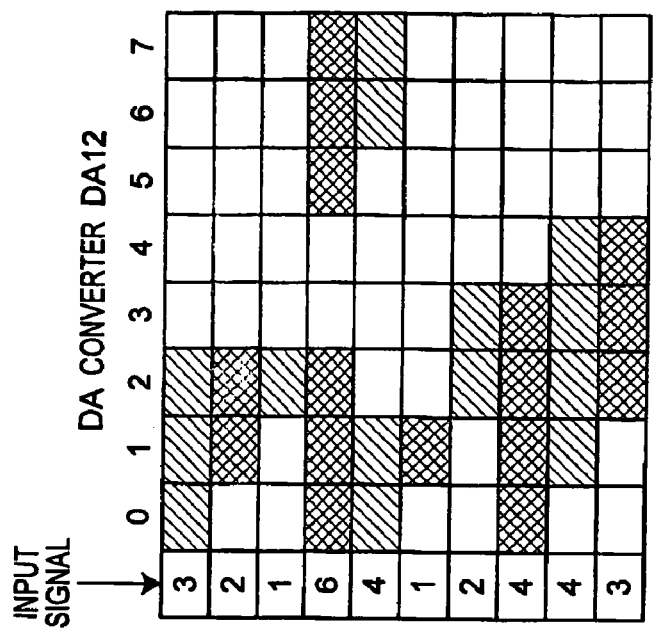
FIG. 14A shows current cells of a DA converter DA11 which are turned on when complex input data changes as 4+3j, 2+5j, 3+j, 6+2j, . . . using the algorithm according to the preferred embodiment.
Figure 14B:
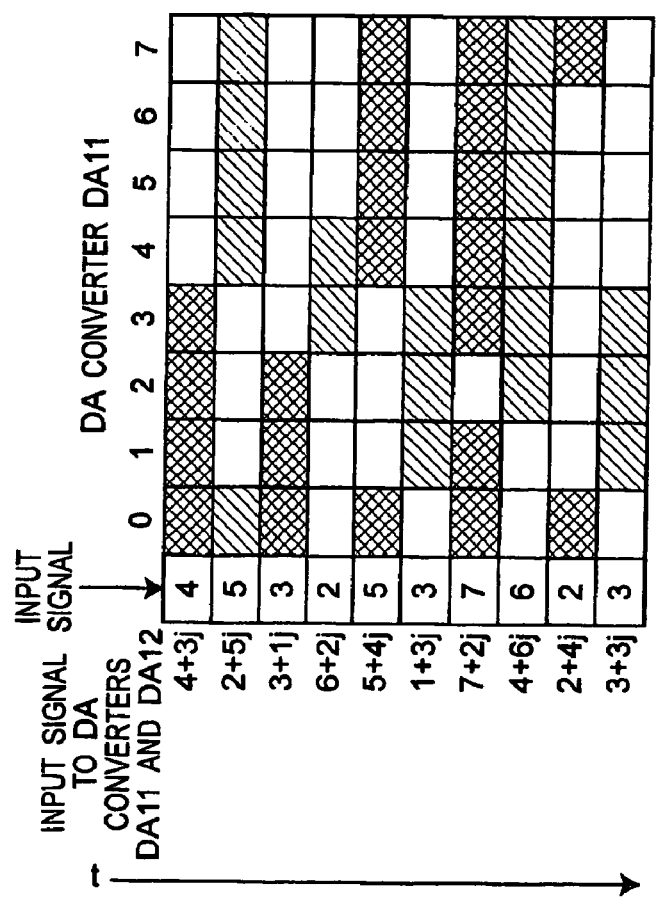
FIG. 14B shows current cells of a DA converter DA12 which are turned on in the case of FIG. 14A.

FIG. 14A shows the current cells of the DA converter DA11 which are turned on when complex input data changes as 4+3j, 2+5j, 3+j, 6+2j, . . . using the algorithm according to the preferred embodiment of the present invention. FIG. 14B shows the current cells of the DA converter DA12 which are turned in the case of FIG. 14A. Double-hatched parts denote the current cells which are turned on in response to the output of the I signal. On the other hand, hatched parts denote the current cells which are turned on in response to the output of the Q signal. The reason why the configuration derived from the algorithm and shown in FIG. 12 can be equivalently realized will be described below.

Figure 7A:
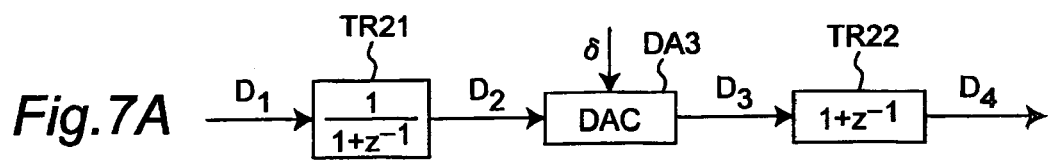
FIG. 7A is a block diagram showing a configuration of a DA converter circuit using the high-pass element rotation method according to the prior art.
Figure 7B:
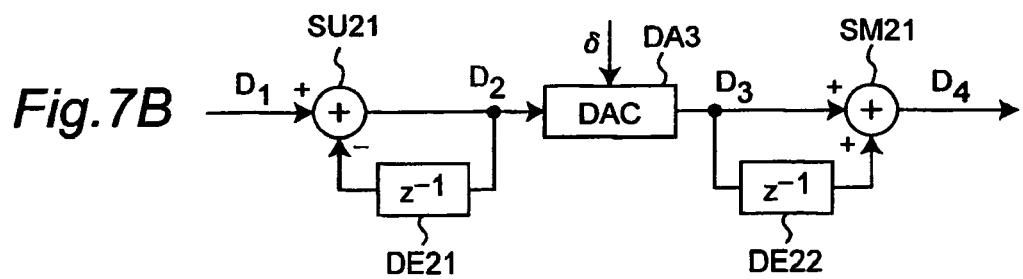
FIG. 7B is an equivalent block diagram of the DA converter circuit of FIG. 7A.
Figure 8:
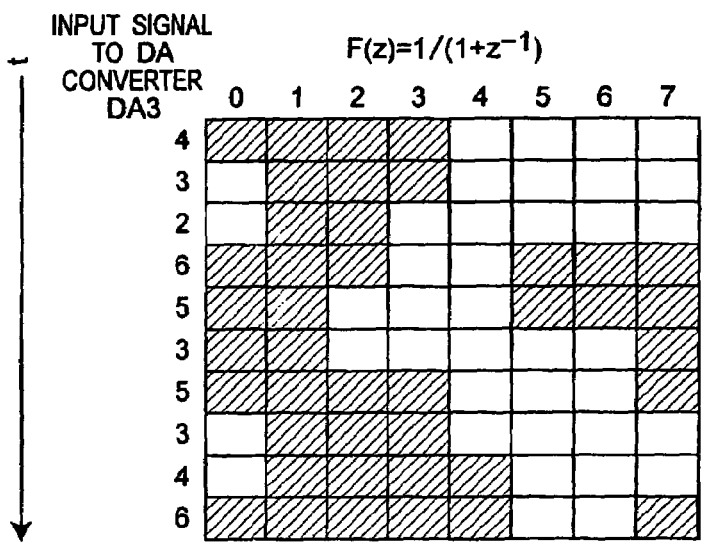
FIG. 8 shows current cells which are turned on when input data changes as 4, 3, 2, 6, 5, . . . in the case of noise-shaping a non-linearity of the DA converter of 3-bit segment type using a high-pass noise-shaping element rotation method according to the prior art.

First of all, the operation of the I channel will be discussed. The configuration relating to the output signal $I_4$ of the I path shown in the upper half of FIG. 12 is "high-pass digital filter plus DA converter plus low-pass analog filter". The Equations (23) and (15) are compared taking attention to the left part in FIG. 7B and the upper-left part in FIG. 12. Replacing $Q_2$ (n) in the Equation (23) by $I_2$ (n), the Equation (23) corresponds to the Equation (15). The Equations (24) and (16) are compared taking attention to the right part in FIG. 7B and the upper-right part in FIG. 12. Replacing $Q_3$ (n) in the Equation (24) by $I_3$ (n), the Equation (24) corresponds to the Equation (16). In a manner similar to above, the Equation (25) corresponds to the Equation (17). As a result, the following conclusion is obtained.

(A) The high-pass element rotation algorithm, in which the internal I and Q paths are alternately changed over, is applied to the output signal $I_4$ from the I-channel DA converter DA11.

Next, the Q channel will be discussed. The configuration relating to the output signal $Q_4$ of the Q path shown in the lower half of FIG. 12 is "low-pass digital filter plus DA converter plus high-pass analog filter". The Equations (26) and (8) are compared taking attention to the left part of FIG. 4B and the lower-left part in FIG. 12. Replacing $I_2$ (n) in the Equation (26) by $Q_2$ (n), the Equation (26) corresponds to the Equation (8). The Equations (27) and (9) are compared taking attention to the right part of FIG. 4B and the lower-right part in FIG. 12. Replacing $I_3$ (n) in the Equation (27) by $Q_3$ (n), the Equation (27) corresponds to the Equation (9). In a manner similar to that of above, the Equation (28) corresponds to the Equation (10). As a result, the following conclusion is obtained.

(B) The low-pass element rotation algorithm, in which the internal I and Q paths are alternately switched over, is applied to the output signal $Q_4$ from the Q-channel DA converter DA12.

The alternate action between the I and Q paths shown in FIG. 12 can be represented by the equivalent Equations (23), (24), (26) and (27). From the Equations (23) and (24), the output signal $I_4$ of the I channel at the timing "n+1" is a function of the internal-state signal ($Q_2$ (n), $Q_3$ (n)) of the Q channel at the timing "n". In a manner similar to that of above, from the Equations (26) and (27), the output signal $Q_4$ of the Q channel at the timing "n+1" is a function of the internal-state signal ($I_2$ (n), $I_3$ (n)) of the I channel at the timing "n". The following conclusion is obtained when the internal states of the I and Q paths are stored using the indicated values $P_1$ (n) and $P_2$ (n) as indicated by the pointers P1 and P2 of the two DA converters DA11 and DA12.

(C) At the timing "2n", the DA converter DA11 is used for the I channel. On the other hand, the DA converter DA12 is used for the Q channel. At the timing "2n+1", the DA converter DA11 is used for the Q channel. On the other hand, the DA converter DA12 is used for the I channel.

More concretely, this operation is as follows:

(1) The operation of the DA converters DA 11 and DA12 are controlled so that the digital output signals Iout and Qout from the AD converters AD11 and AD12 are alternately inputted and outputted with a predetermined period of a clock signal for the DA converters DA11 and DA12.

(2) The high-pass element rotation method is applied to the I signal. On the other hand, the low-pass element rotation method is applied to the Q signal.

(3) The complex digital filter CDF as provided at the previous stage of the two DA converters DA11 and DA12, and the complex analog filter CAF provided at the next stage of the two DA converters DA11 and DA12 can be realized using the two element rotation methods. This leads to that the non-linearities δ1 and δ2 of the two DA converters DA11 and DA12 are noise-shaped by the first-order complex band-pass filters using the foregoing algorithm.

As above-mentioned, the performance of the complex band-pass ΔΣ AD modulator can be improved by using the new algorithm capable of noise-shaping the non-linearity of the multi-bit DA converter and adding the small-size digital circuit.

(A) In the proposed algorithm, the DA converter DA11 is used for the I channel. On the other hand, the DA converter DA12 is used for the Q channel at the timing "2n". The DA converter DA11 is used for the Q channel. On the other hand, the DA converter DA12 is used for the I channel at the timing "2n+1". The DA converter DA11 and the DA converter DA12 are thus alternately used for the I and Q paths, which, therefore, minimizes the influence from the mismatch value in the characteristics of the two DA converters DA11 and DA12.

(B) Our proposed algorithm can be applied not only to the ΔΣ AD modulator but also to the multi-bit complex band-pass ΔΣ AD modulator.

(C) The essential object is to improve the precision of the analog circuit using the digital signal processing method. However, it is not easy to realize the analog circuit achieving a higher precision only by the technique for configuring the circuit since a power supply voltage has been decreasing along with the progress of the VLSI technology and increasingly refined devices. Therefore, it becomes increasingly important to improve the performance of the analog circuit by means of the digital method. A higher speed, cost reduction and lower power consumption have been promoted for the digital circuit, and the digital circuit can be now easily realized by means of a more complicated digital signal processing algorithm, and this favorably contributes to the improvement of the performance of the analog circuit.

FIG. 15 is a block diagram of a detailed configuration of a complex band-pass $\Delta\Sigma$ AD modulator 7 according to the preferred embodiment of the present invention.

Referring to FIG. 15, the complex band-pass $\Delta\Sigma$ AD modulator 7 is different from the complex band-pass $\Delta\Sigma$ AD modulator 7B of FIG. 13 in the following points.

(A) A digital multiplexer MU1 and two DWA logic circuits DL1 and DL2 are provided in place of the switches S11, S12, S21 and S22 at the previous stage of the DA converters DA11 and DA12 and the pointers P1 and P2.

(B) An analog multiplexer MU2 is provided in place of the switches S31, S32, S41 and S42 at the next stage of the DA converters DA11 and DA12.

In this case, DWA represents data weighted averaging.

In the complex band-pass $\Delta\Sigma$ AD modulator 7 of FIG. 15, a circuit for executing a predetermined DWA process and DA conversion process on three-bit (for example, eight thermometer codes) digital output signals Iout and Qout outputted from the AD converters AD11 and AD12 and feeding back to the subtracters SU31 and SU32 includes the following:

(a) the digital multiplexer MU1 which is provided at the previous stage of the DA converters DA11 and DA12;

(b) the two DWA logic circuits DL1 and DL2, which are the logic circuits for executing the digital signal process on the respective input signals of the DA converters DA11 and DA12;

(c) the DA converters DA11 and DA12 of the two channels; and (d) the analog multiplexer MU2 which is provided at the next stage of the DA converters DA11 and DA12.

Figure 16:
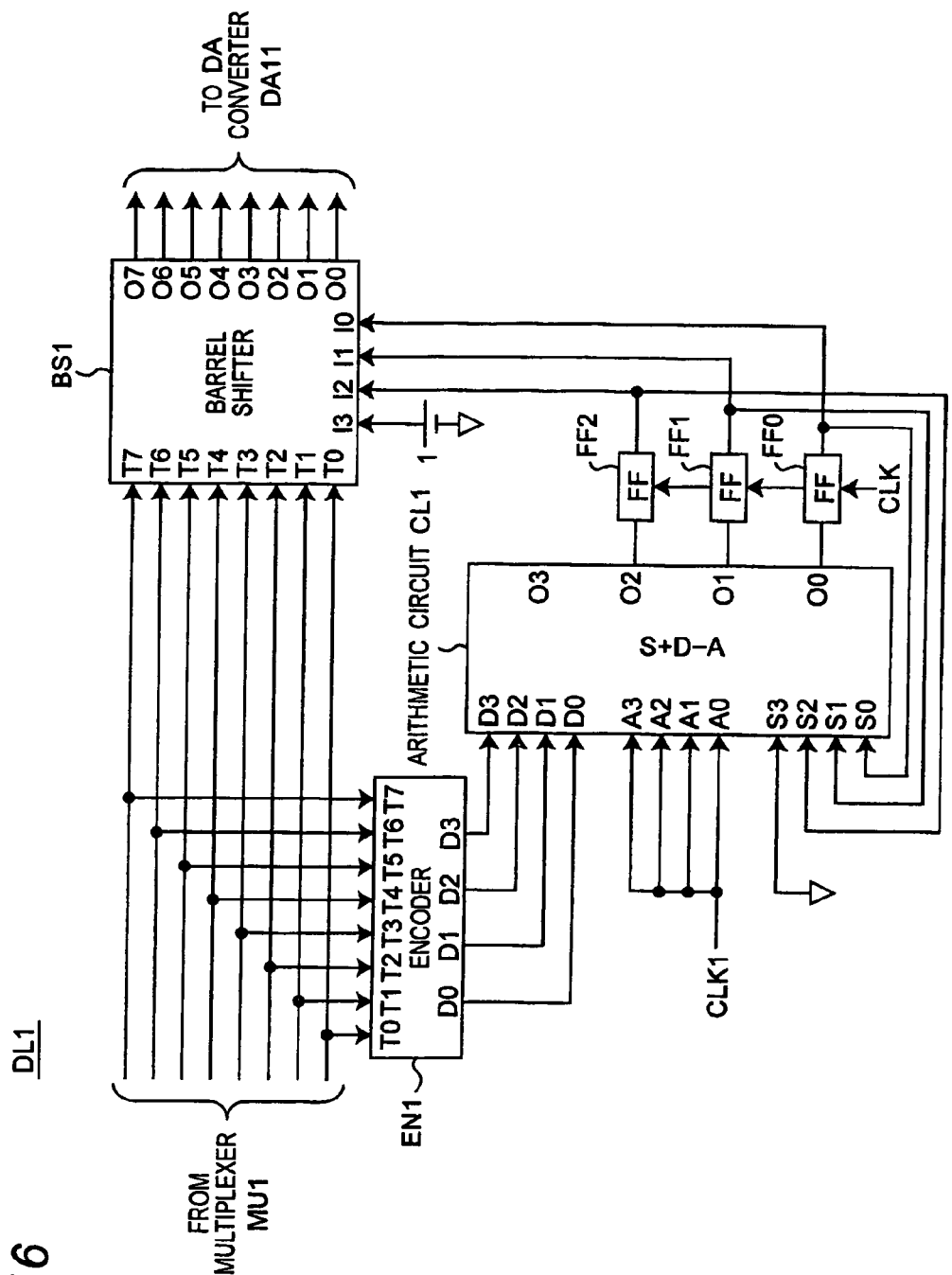
FIG. 16 is a block diagram of a configuration of a DWA logic circuit DL1 shown in FIG. 15.
Figure 17:
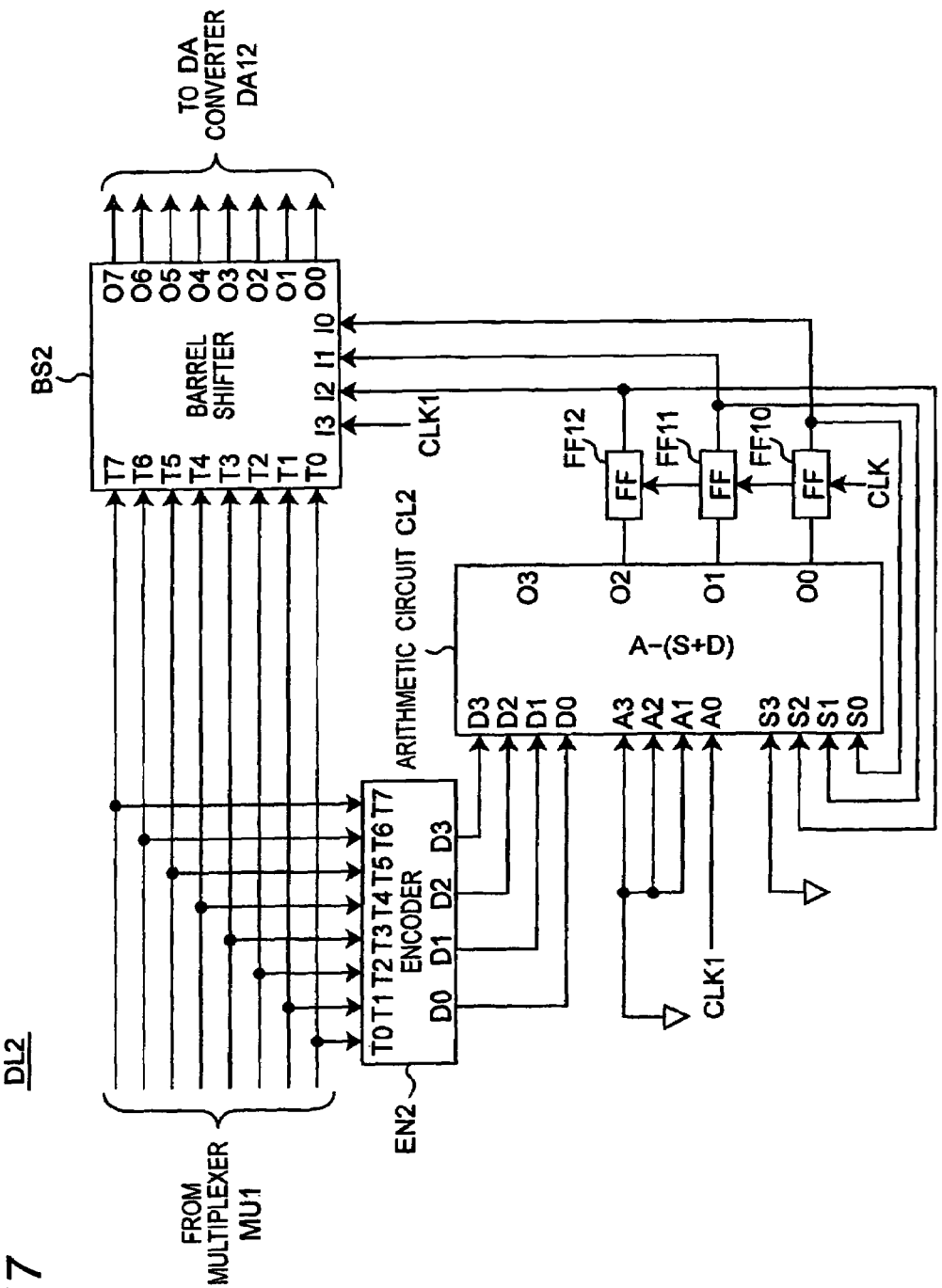
FIG. 17 is a block diagram of a configuration of a DWA logic circuit DL2 shown in FIG. 15.

Referring to FIG. 15, signal paths from the respective AD converters AD11 and AD12 to the DA converters DA11 and DA12 via the multiplexer MU1 and the respective DWA logic circuits DL1 and DL2 are provided with a reference numeral "8" denoting the eight lines (3-bit) in an example of the thermometer codes, which applies to FIGS. 16 and 17 as well.

In the present embodiment, the internal AD converters AD11 and AD12 and the DA converters DA11 and DA12 will be described with reference to the case of three bits (nine levels). There are eight lines of digital output signals Iout and Qout in the respective AD converters AD11 and AD12 since the AD converters AD11 and AD12 used in the present embodiment are assumed to be of a 9-level flash type, in which eight comparator output signals are outputted in a form of the thermometer codes as they are. In a manner to similar to that of above, there are eight lines of input signals in the respective DA converters DA11 and DA12 since the DA converters DA11 and DA12 used in the present embodiment are assumed to be of a 9-level segment type. The digital multiplexer MU1 and the analog multiplexer MU2 operate in synchronization to each other so that a select signal is inverted for each sampling clock signal and selectively switched over to be allocated to the I and Q paths of the DA converter DA11 and the DA converter DA12.

Figure 18:
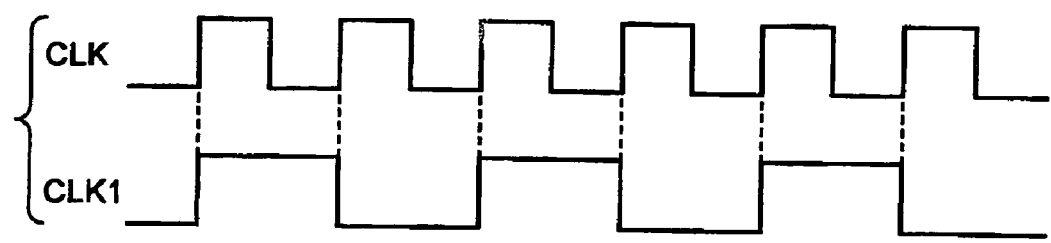
FIG. 18 is a timing chart of clock signals CLK and CLK1 which are supplied to the DWA logic circuit DL1 of FIG. 16 and the DWA logic circuit DL2 of FIG. 17.
Figure 19:
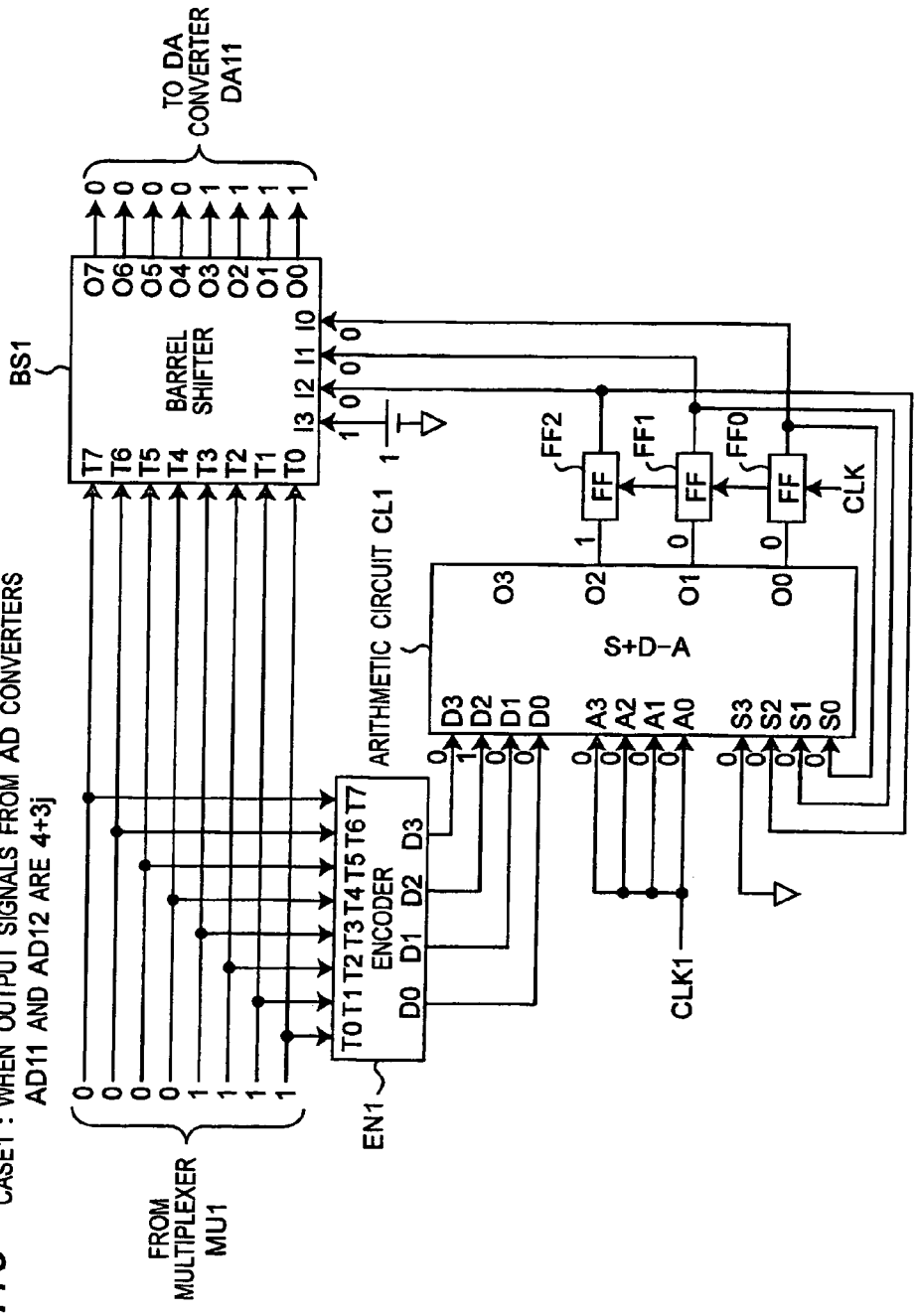
FIG. 19 is a block diagram showing an operation of the DWA logic circuit DL1 of FIG. 16 in a case 1.
Figure 20:
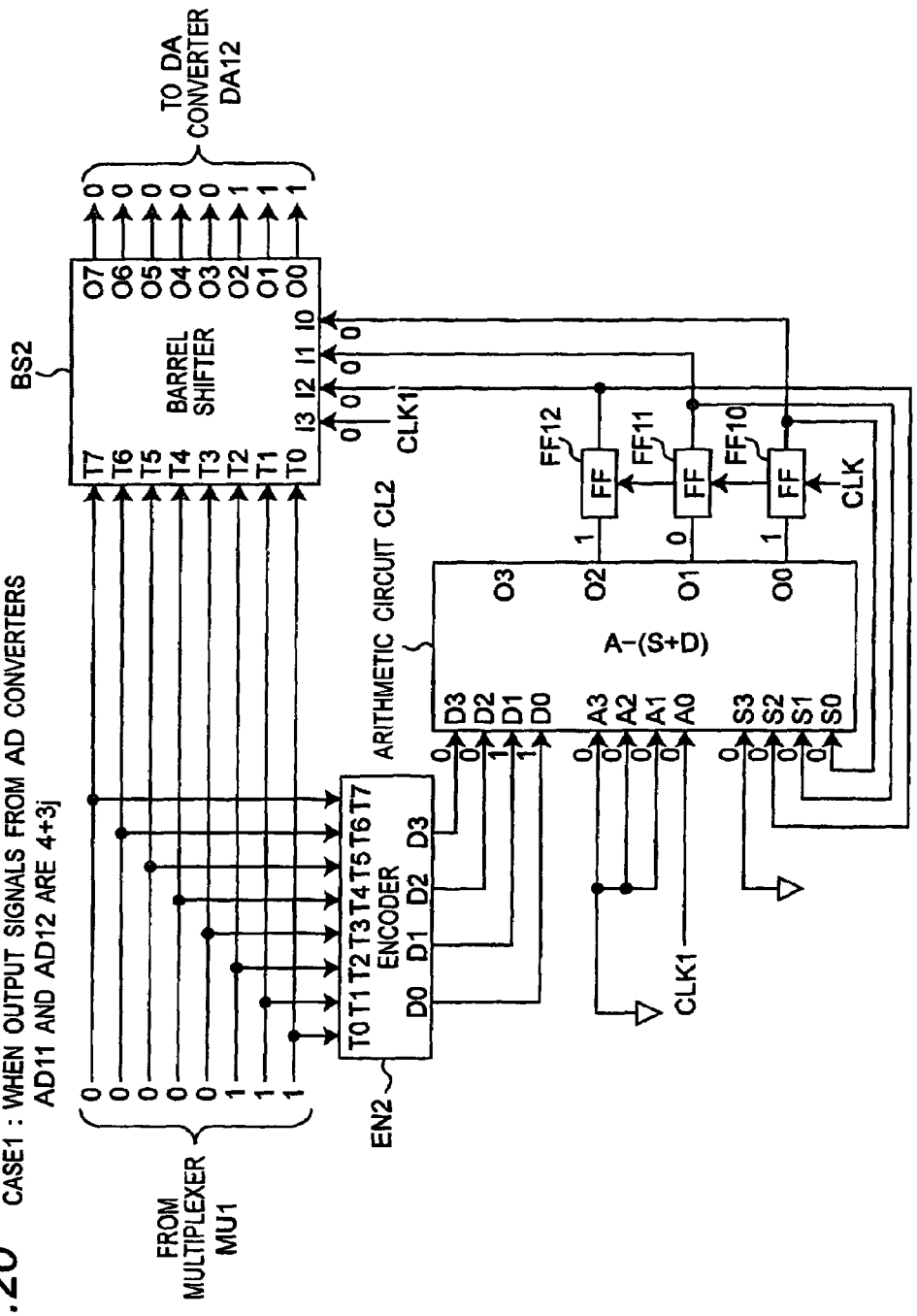
FIG. 20 is a block diagram showing an operation of the DWA logic circuit DL2 of FIG. 17 in the case 1.
Figure 21:
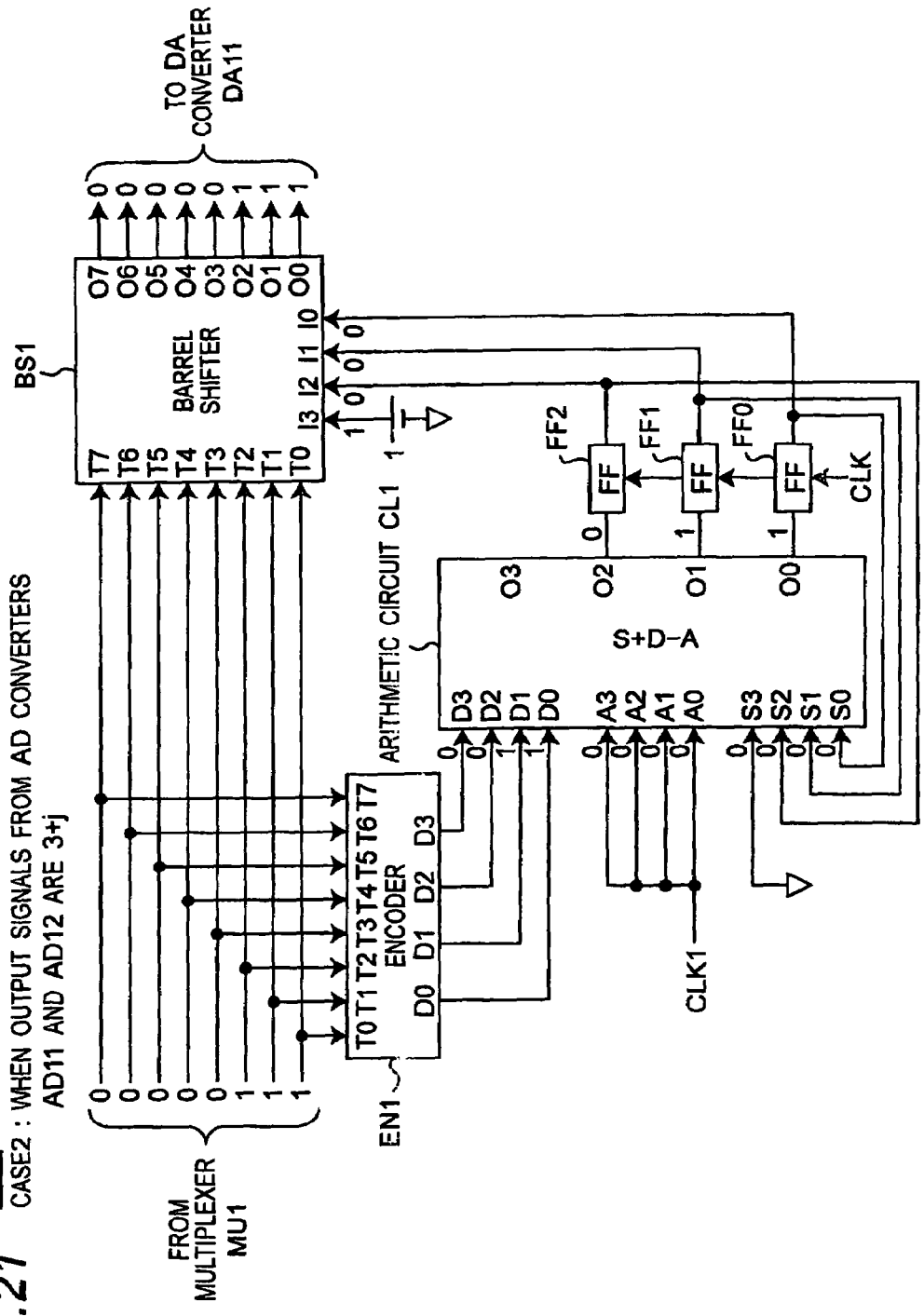
FIG. 21 is a block diagram showing an operation of the DWA logic circuit DL1 of FIG. 16 in a case 2.
Figure 22:
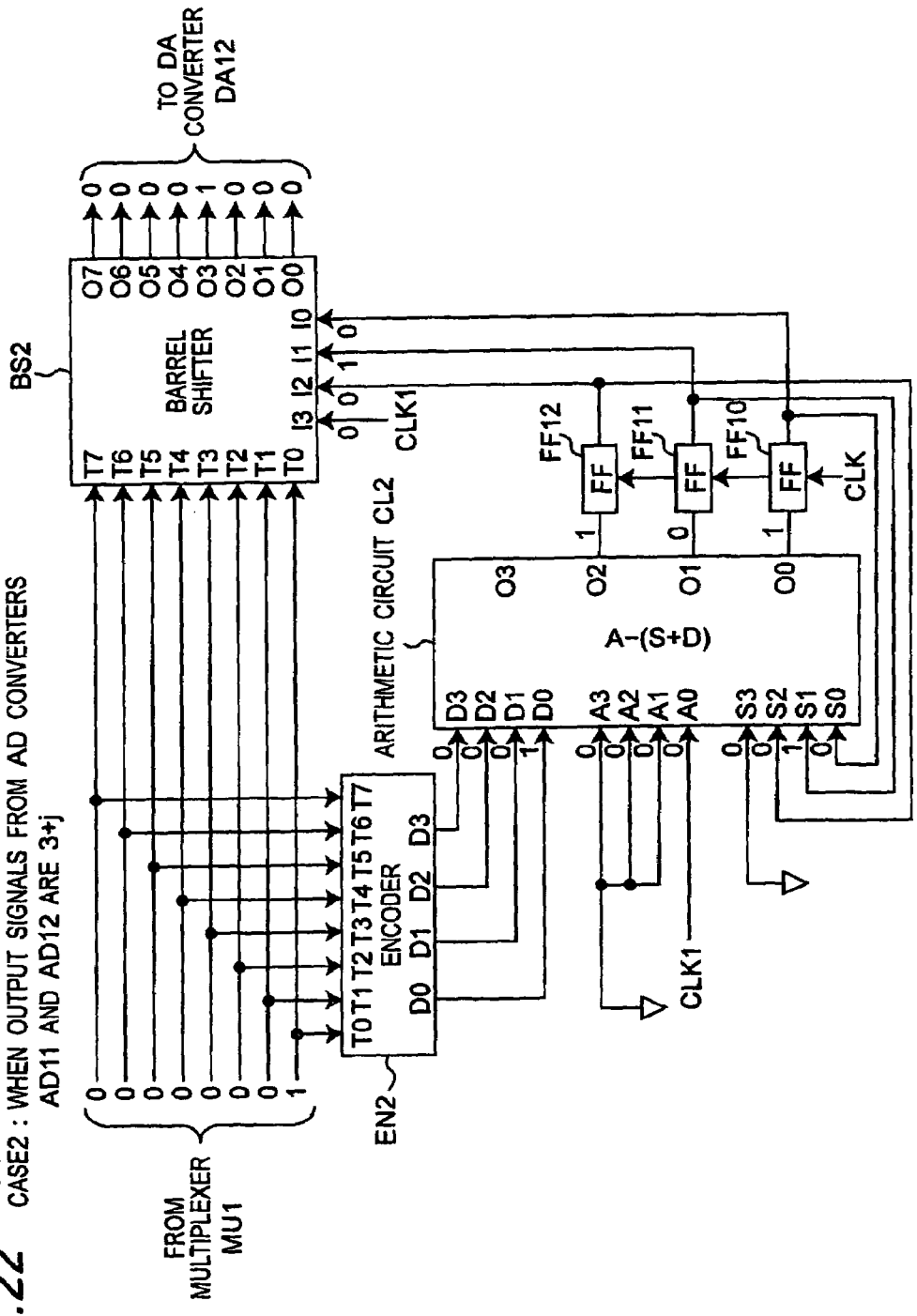
FIG. 22 is a block diagram showing an operation of the DWA logic circuit DL2 of FIG. 17 in the case 2.

FIG. 16 is a block diagram of a configuration of the DWA logic circuit DL1 shown in FIG. 15. FIG. 17 is a block diagram of a configuration of the DWA logic circuit DL2 shown in FIG. 15. FIG. 18 is a timing chart of clock signals CLK and CLK1 as the sampling clocks supplied to the DWA logic circuit DL1 of FIG. 16 and the DWA logic circuit DL2 of FIG. 17. As shown in FIG. 18, the clock signal CLK has a period or cycle equal to half of a period of the clock signal CLK1, and the clock signals CLK and CLK1 are synchronized with each other.

Referring to FIG. 16, the DWA logic circuit DL1 includes an encoder EN1, an arithmetic circuit CL1, a barrel shifter BS1, and three flip-flops FF0 to FF2 of register circuits. The digital output signals of the 8-bit thermometer codes inputted from the AD converters AD11 and AD12 via the multiplexer MU1 are inputted to the encoder EN1 and the barrel shifter BS1. The encoder EN1 converts input signals T0 to T7 of the 8-bit thermometer codes into 4-bit binary signals, and outputs them to D input terminals D0 to D3 of the arithmetic circuit CL1. In the encoder EN1, the signals are converted so that output signals (D3, D2, D1, D0)=(0, 0, 1, 1) when the input signals (T7, T6, T5, T4, T3, T2, T1, T0)=(0, 0, 0, 0, 0, 1, 1, 1), and the output signal (D3, D2, D1, D0)=(0, 1, 1, 0) when the input signals (T7, T6, T5, T4, T3, T2, T1, T0)=(0, 0, 1, 1, 1, 1, 1, 1). In this case, "1" denotes a high-level signal, while "0" denotes a low-level signal.

The arithmetic circuit CL1 executes four-bit, three-input and binary addition and subtraction processes (S+D−A). More concretely, the arithmetic circuit CL1 calculates a sum of the data signals inputted to the D input terminals and the data signals inputted to S input terminals, and subtracts the data signals inputted to A input terminals from the sum, and further, outputs subtracted results from O output terminals. The arithmetic circuit CL1 can be efficiently realized using a carry-save adder or the like. The clock signal CLK1 is inputted to respective bits A0 to A3 of the A input terminals of the arithmetic circuit CL1. The clock signal CLK1 is a clock signal in which "0" and "1" are alternately inverted at each leading edge of the clock signal CLK as the sampling clock signal, as shown in FIG. 18. More concretely, the minimum value of "000" and the maximum value of "111" are alternately inputted to the respective bits A0 to A3 of the A input terminals of the arithmetic circuit CL1 at each leading edge of the clock signal CLK. Further, the three-bit output signals from O output terminals O0 to O2 of the arithmetic circuit CL1 are temporarily held or retained and stored in the flip-flops FF0 to FF2, and fed back to the S input terminals S0 to S2 of the arithmetic circuit CL1 and outputted to I input terminals I0 to I2 (shift amount designating terminals) of the barrel shifter BS1. The most significant bit S3 of the S input terminals of the arithmetic circuit CL1 is grounded and the "0" signal is inputted thereto.

The barrel shifter BS1 is an 8-bit left-shift circuit of rotation type having a ring shape, and a shift amount thereof is designated by the lower three bits I2, I1 and I0 of the I input terminals. More concretely, the barrel shifter BS1 rotates the input signal to be shifted counterclockwise by the designated shift amount, and then outputs the shifted 8-bit output signal to the DA converter DA11. The most significant bit I3 of the I input terminals is supplied with a predetermined high-level voltage and fixedly set to "1". In the barrel shifter BS1, for example, the output signals (O7, O6, O5, O4, O3, O2, O1, O0)=(0, 0, 0, 1, 1, 0, 0, 0) when the input signals (T7, T6, T5, T4, T3, T2, T1, T0)=(0, 0, 0, 0, 0, 0, 1, 1) and the shift amount signals (I2, I1, I0)=(0, 1, 1), and the output signals (O7, O6, O5, O4, O3, O2, O1, O0)=(1, 1, 1, 0, 0, 0, 1, 1) when the input signals (T7, T6, T5, T4, T3, T2, T1, T0)=(0, 0, 0, 1, 1, 1, 1, 1) and the shift amount signals (I2, I1, I0)=(1, 0, 1).

In a manner similar to that of the DWA logic circuit DL1 of FIG. 16, the DWA logic circuit DL2 of FIG. 17 includes an encoder EN2, an arithmetic circuit CL2, a barrel shifter BS2, and three flip-flops FF10 to FF12 of register circuits.

The DWA logic circuit DL2 is different from the DWA logic circuit DL1 in the following points.

(A) The digital output signal of the 8-bit thermometer code inputted from the AD converter AD11 or the AD converter AD12 via the multiplexer MU1 is inputted to the encoder EN2 and the barrel shifter BS2, however, the output signal from the barrel shifter BS2 is outputted to the DA converter DA 12.

(B) The arithmetic circuit CL2 executes four-bit, three-input and binary addition and subtraction processes (A−(S+D)). More concretely, the arithmetic circuit CL2 subtracts a sum of the data signals inputted to the S input terminals and the data signals inputted to the D input terminals from the data signals inputted to the A input terminals, and outputs subtracted results from the O output terminals. The least significant bit A0 of the A input terminals is supplied with the clock signal CLK1. On the other hand, the more significant bits A1 to A3 are grounded, and the "0" data signal is inputted thereto.

(C) The barrel shifter BS2 is an 8-bit left-shift (or counterclockwise shift) and right-shift (or clockwise shift) circuit of rotation type having a ring shape, and shifts the input signal to left or counterclockwise when the most significant bit I3 of the I input terminals is "1", with shifting the input signal to right or clockwise when the same is "0". A shift amount thereof is designated by the lower three bits I0 to I2 of the I input terminals. The clock signal CLK1 is inputted to the most significant bit I3 of the I input terminals. The barrel shifter BS2 is controlled in such manner that the left shift (or counterclockwise shift) and the right shift (or clockwise shift) are selectively and alternately changed over at each leading edge of the sampling clock signal.

FIGS. 19 to 26 are block diagrams showing operations of the DWA logic circuit DL1 of FIG. 16 and the DWA logic circuit DL2 of FIG. 17 respectively in the cases 1 to 4. In FIGS. 19 to 26, the operations in the case that the complex output data signals from the AD converters AD11 and AD12 shifts as 4+3j, 2+5j, 3+j, 6+2j, . . . . It is clearly understood from FIGS. 19 to 26 that the operations shown therein correspond to the turned-on current cells of the DA converters DA 11 and DA12 of FIG. 5 which are obtained from the above-mentioned algorithm.

IMPLEMENTAL EXAMPLES

The inventors of the present invention established a program for describing a circuit configuration and an operation of the complex band-pass ΔΣ AD modulator 7 shown in FIG. 15 according to the present embodiment in C language and inputted random input data signals thereto so as to carry out simulations. The inventors carried out the simulations relating to the foregoing algorithm (logical expression) and the output of the complex band-pass ΔΣ AD modulator 7, 100,000, 000 times, and the inventors confirmed that the both output data correspond to each other.

The complex band-pass ΔΣ AD modulator 7 of FIG. 15 according to the present embodiment was described based on the 8-bit circuit, however, the circuit may constitute a circuit of a plurality of optional bits.

In the DWA logic circuits DL1 and DL2 of FIGS. 16 and 17, the circuit for executing the DWA algorithm on the input signal of the thermometer code will be described. However, the present invention is not limited to this. The input signal may be a different data signal of, for example, a binary code where the encoders EN1 and EN2 may be omitted. In the above-mentioned description, the AD converters of the flash type are used as the AD converters AD11 and AD12. The present invention, however, is not limited thereto, and an AD converter of any other type may be used.

The analog signal processing unit of the complex band-pass ΔΣ AD modulator 7 of FIG. 15 may be realized by means of a switched capacitor circuit or a continuous time analog circuit.

APPLICABIBILITY OF INDUSTRIAL UTILIZATION

As mentioned above, according to the complex band-pass ΔΣ AD modulator according to the present invention, there can be provided the complex band-pass ΔΣ AD converter circuit and the digital radio receiver using the same having a simpler configuration and executing a process at a speed higher than that of the prior art. More concretely, the DWA algorithm capable of applying a first-order noise shaping to a non-linearity of the DA converter of the multi-bit complex band-pass ΔΣ AD modulator for processing first and second signals orthogonal to each other can be realized by means of hardware circuit by additionally supplying a relatively small-size digital circuit and an analog multiplexer to the hardware circuit. Accordingly, reductions in power consumption and chip area can be realized in, for example, Bluetooth and a Low-IF receiver of broad-band LAN or the like.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A complex band-pass ΔΣ AD modulator comprising:
   a subtracter device for subtracting a DA converted complex analog signal from first and second DA converters, from a complex analog signal including inputted first and second analog signals orthogonal to each other, and outputting a subtracted complex analog signal;
   a complex band-pass filter for band-pass-filtering the subtracted complex analog signal and outputting a band-pass-filtered complex analog signal;
   first and second AD converters for AD converting the band-pass-filtered complex analog signal into an AD converted complex digital signal including first and second digital signals orthogonal to each other, and outputting the AD converted complex digital signal; and
   said first and second DA converters for DA converting the AD converted complex digital signal into the DA converted complex analog signal, and outputting the DA converted complex analog signal to said subtracter device;
   characterized in that said complex band-pass ΔΣ AD modulator further comprises first and second multiplexers, and first and second logic circuits,
   wherein a clock signal has a predetermined period of time, and has first and second timings alternately generated,
   wherein at the first timing, said first multiplexer inputs and outputs the first and second digital signals from said first and second AD converters to said first and second logic circuits, respectively, and at the second timing, inputs the first and second digital signals from said first and second AD converters, and outputs the first digital signal to the second logic circuit and outputs the second digital signal to said first logic circuit, wherein said first and second logic circuits substantially noise-shapes non-linearities of said first and second DA converters by realizing a complex digital filter as virtually provided at the previous stage of said first and second DA converters and a complex analog filter as virtually provided at the next stage of said first and second DA converters, using a high-pass element rotation method for the first digital signal and a low-pass element rotation method for the second digital signal, and wherein, at the first timing, said second multiplexer inputs and outputs the first and second digital signals from said first and second DA converters as first and second DA converted analog signals to said subtracter device, respectively, and at the second timing, inputs the first and second digital signals from said first and second DA converters, and outputs the first digital signal as a second DA converted analog signal to said subtracter device and outputs the second digital signal as a first DA converted analog signal to said subtracter device.

2. The complex band-pass ΔΣ AD modulator as claimed in claim 1,
wherein each of said first and second logic circuits comprises:
an arithmetic circuit for executing a predetermined calculation on an inputted digital signal, and outputting a calculated value; and
a barrel shifter for shifting the inputted digital signal by a shift amount of the calculated value calculated by said arithmetic circuit, and outputting a shifted digital signal.

3. The complex band-pass ΔΣ AD modulator as claimed in claim 2,
wherein said arithmetic circuit of said first logic circuits operates in synchronization with the clock signal, calculates a sum of the inputted digital signal and a digital signal outputted from the arithmetic circuit one period prior to a current timing to be processed, subtracts a digital signal having a minimum value and a maximum value which are alternately changed relative to the clock signal from a calculated sum, and outputs the calculated value of a subtracted value,
wherein said barrel shifter of said first logic circuit operates in synchronization with the clock signal, has a ring shape of a predetermined number of bits, shifts the inputted digital signal counterclockwise by the shift amount of the calculated value, and outputs a shifted digital signal,
wherein said arithmetic circuit of said second logic circuit operates in synchronization with the clock signal, subtracts a sum of the inputted digital signal and the digital signal outputted from said arithmetic circuit one period prior to the current timing to be processed from a digital signal having a value of "1" and "0" which are alternately changed relative to the clock signal, and outputs the calculated value of a subtracted value, and
wherein said barrel shifter of said second logic circuit operates in synchronization with the clock signal having the period, has a ring shape of a predetermined number of bits, shifts the inputted digital signal by the shift amount of the calculated value in directions of clockwise and counterclockwise which are alternately changed over per the clock signal, and outputs a shifted digital signal.

4. The complex band-pass ΔΣ AD modulator as claimed in claim 1,
wherein each of said first and second logic circuits further comprises an encoder for encoding the inputted digital signal having a further code different from a binary code so as to generate a digital signal of the binary code and outputting an encoded digital signal to said arithmetic circuit.

5. The complex band-pass ΔΣ AD modulator as claimed in claim 4,
wherein the further code is a thermometer code.

6. An AD converter circuit comprising:
a complex band-pass ΔΣ AD modulator; and
a decimation circuit for performing a digital complex band-pass filtering by executing a predetermined decimation process on the digital signal outputted from the complex band-pass ΔΣ AD modulator,
wherein complex band-pass ΔΣ AD modulator comprises:
a subtracter device for subtracting a DA converted complex analog signal from first and second DA converters, from a complex analog signal including inputted first and second analog signals orthogonal to each other, and outputting a subtracted complex analog signal;
a complex band-pass filter for band-pass-filtering the subtracted complex analog signal and outputting a band-pass-filtered complex analog signal;
first and second AD converters for AD converting the band-pass-filtered complex analog signal into an AD converted complex digital signal including first and second digital signals orthogonal to each other, and outputting the AD converted complex digital signal; and
said first and second DA converters for DA converting the AD converted complex digital signal into the DA converted complex analog signal, and outputting the DA converted complex analog signal to said subtracter device;
wherein said complex band-pass ΔΣ AD modulator further comprises first and second multiplexers, and first and second logic circuits,
wherein a clock signal has a predetermined period of time, and has first and second timings alternately generated,
wherein at the first timing, said first multiplexer inputs and outputs the first and second digital signals from said first and second AD converters to said first and second logic circuits, respectively, and at the second timing, inputs the first and second digital signals from said first and second AD converters, and outputs the first digital signal to said second logic circuit and outputs the second digital signal to said first logic circuit,
wherein said first and second logic circuits substantially noise-shapes non-linearities of said first and second DA converters by realizing a complex digital filter as virtually provided at the previous stage of said first and second DA converters and a complex analog filter as virtually provided at the next stage of said first and second DA converters, using a high-pass element rotation method for the first digital signal and a low-pass element rotation method for the second digital signal, and wherein, at the first timing, said second multiplexer inputs and outputs the first and second digital signals from said first and second DA converters as first and second DA converted analog signals to said subtracter device, respectively, and at the second timing, inputs the first and second digital signals from said first and second DA converters, and outputs the first digital signal as a second DA converted analog signal to said subtracter device and outputs the second digital signal as a first DA converted analog signal to said subtracter device.

7. The AD converter circuit as claimed in claim 6,
wherein each of said first and second logic circuits comprises:
an arithmetic circuit for executing a predetermined calculation on an inputted digital signal, and outputting a calculated value; and
a barrel shifter for shifting the inputted digital signal by a shift amount of the calculated value calculated by said arithmetic circuit, and outputting a shifted digital signal.

8. The AD converter circuit as claimed in claim 7,
wherein said arithmetic circuit of said first logic circuit operates in synchronization with the clock signal, calculates a sum of the inputted digital signal and a digital signal outputted from the arithmetic circuit one period prior to a current timing to be processed, subtracts a digital signal having a minimum value and a maximum value which are alternately changed relative to the clock signal from a calculated sum, and outputs the calculated value of a subtracted value,
wherein said barrel shifter of said first logic circuit operates in synchronization with the clock signal, has a ring shape of a predetermined number of bits, shifts the inputted digital signal counterclockwise by the shift amount of the calculated value, and outputs a shifted digital signal,
wherein said arithmetic circuit of said second logic circuit operates in synchronization with the clock signal, subtracts a sum of the inputted digital signal and the digital signal outputted from said arithmetic circuit one period prior to the current timing to be processed from a digital signal having a value of "1" and "0" which are alternately changed relative to the clock signal, and outputs the calculated value of a subtracted value, and
wherein said barrel shifter of said second logic circuit operates in synchronization with the clock signal, has a ring shape of a predetermined number of bits, shifts the inputted digital signal by the shift amount of the calculated value in a direction of clockwise and counterclockwise which are alternately changed relative to the clock signal, and outputs a shifted digital signal.

9. The AD converter circuit as claimed in claim 6,
wherein each of said first and second logic circuits further comprises an encoder for encoding the inputted digital signal having a further code different from a binary code so as to generate a digital signal of the binary code and outputting an encoded digital signal to said arithmetic circuit.

10. The AD converter circuit as claimed in claim 9,
wherein the further code is a thermometer code.

11. A digital radio receiver for receiving an analog radio signal and outputting a digital signal, comprising an AD converter circuit,
wherein said AD converter circuit comprises:
a complex band-pass ΔΣ AD modulator; and
a decimation circuit for, performing a digital complex band-pass filtering by executing a predetermined decimation process on the digital signal outputted from the complex band-pass ΔΣ AD modulator,
wherein complex band-pass ΔΣ AD modulator comprises:
a subtracter device for subtracting a DA converted complex analog signal from first and second DA converters, from a complex analog signal including inputted first and second analog signals orthogonal to each other, and outputting a subtracted complex analog signal;
a complex band-pass filter for band-pass-filtering the subtracted complex analog signal and outputting a band-pass-filtered complex analog signal;
first and second AD converters for AD converting the band-pass-filtered complex analog signal into an AD converted complex digital signal including first and second digital signals orthogonal to each other, and outputting the AD converted complex digital signal; and
said first and second DA converters for DA converting the AD converted complex digital signal into the DA converted complex analog signal, and outputting the DA converted complex analog signal to said subtracter device;
wherein said complex band-pass ΔΣ AD modulator further comprises first and second multiplexers, and first and second logic circuits,
wherein a clock signal has a predetermined period of time, and has first and second timings alternately generated,
wherein at the first timing, said first multiplexer inputs and outputs the first and second digital signals from said first and second AD converters to said first and second logic circuits, respectively, and at the second timing, inputs the first and second digital signals from said first and second AD converters, and outputs the first digital signal to said second logic circuit and outputs the second digital signal to said first logic circuit,
wherein said first and second logic circuits substantially noise-shapes non-linearities of said first and second DA converters by realizing a complex digital filter as virtually provided at a previous stage of said first and second DA converters and a complex analog filter as virtually provided at the next stage of said first and second DA converters, using a high-pass element rotation method for the first digital signal and a low-pass element rotation method for the second digital signal, and
wherein, at the first timing, said second multiplexer inputs and outputs the first and second digital signals from said first and second DA converters as first and second DA converted analog signals to said subtracter device, respectively, and at the second timing, inputs the first and second digital signals from said first and second DA converters, and outputs the first digital signal as a second DA converted analog signal to said subtracter device and outputs the second digital signal as a first DA converted analog signal to said subtracter device.

12. The digital radio receiver as claimed in claim 11,
wherein each of said first and second logic circuits comprises:
an arithmetic circuit for executing a predetermined calculation on an inputted digital signal, and outputting a calculated value; and
a barrel shifter for shifting the inputted digital signal by a shift amount of the calculated value calculated by said arithmetic circuit, and outputting a shifted digital signal.

13. The digital radio receiver as claimed in claim 12,
wherein said arithmetic circuit of said first logic circuit operates in synchronization with the clock signal, calculates a sum of the inputted digital signal and a digital signal outputted from the arithmetic circuit one period prior to a current timing to be processed, subtracts a digital signal having a minimum value and a maximum value which are alternately changed relative to the clock signal from a calculated sum, and outputs the calculated value of a subtracted value, wherein said barrel shifter of said first logic circuit operates in synchronization with the clock signal, has a ring shape of a predetermined number of bits, shifts the inputted digital signal counterclockwise by the shift amount of the calculated value, and outputs a shifted digital signal, wherein said arithmetic circuit of said second logic circuit operates in synchronization with the clock signal, subtracts a sum of the inputted digital signal and the digital signal outputted from said arithmetic circuit one period prior to the current timing to be processed from a digital signal having a value of "1" and "0" which are alternately changed relative to the clock signal, and outputs the calculated value of a subtracted value, and wherein said barrel shifter of said second logic circuit operates in synchronization with the clock signal, has a ring shape of a predetermined number of bits, shifts the inputted digital signal by the shift amount of the calculated value in a direction of clockwise and counterclockwise which are alternately changed relative to the clock signal, and outputs a shifted digital signal.

14. The digital radio receiver as claimed in claim 11, wherein each of said first and second logic circuits further comprises an encoder for encoding the inputted digital signal having a further code different from a binary code so as to generate a digital signal of the binary code and outputting an encoded digital signal to said arithmetic circuit.

15. The digital radio receiver as claimed in claim 14, wherein the further code is a thermometer code.

* * * * *

UNITED STATES PATENT AND TRADEMARK OFFICE
CERTIFICATE OF CORRECTION

PATENT NO. : 7,098,828 B2
APPLICATION NO. : 11/157848
DATED : August 29, 2006
INVENTOR(S) : Hao San et al.

Page 1 of 1

It is certified that error appears in the above-identified patent and that said Letters Patent is hereby corrected as shown below:

Title page 2, Item [56] Column 2, Line 14, please delete "F. Henkel, et al., ..."

Signed and Sealed this
Twenty-sixth Day of June, 2012

David J. Kappos
*Director of the United States Patent and Trademark Office*

UNITED STATES PATENT AND TRADEMARK OFFICE
CERTIFICATE OF CORRECTION

PATENT NO. : 7,098,828 B2
APPLICATION NO. : 11/157848
DATED : August 29, 2006
INVENTOR(S) : Hao San et al.

Page 1 of 1

It is certified that error appears in the above-identified patent and that said Letters Patent is hereby corrected as shown below:

Title page 2, Item [56] Column 2, Line 14, please delete "F. Henkel, et al., ..." through the end of "Other Publications" on Page 3, Column 2, line 4.

This certificate supersedes the Certificate of Correction issued June 26, 2012.

Signed and Sealed this
Thirty-first Day of July, 2012

David J. Kappos
*Director of the United States Patent and Trademark Office*